(12) United States Patent
Lee et al.

(10) Patent No.: US 11,588,016 B2
(45) Date of Patent: Feb. 21, 2023

(54) SEMICONDUCTOR DEVICE HAVING A SUPER JUNCTION STRUCTURE AND METHOD OF MANUFACTURING THE SAME

(71) Applicant: SEMICONDUCTOR COMPONENTS INDUSTRIES, LLC, Phoenix, AZ (US)

(72) Inventors: Jae-gil Lee, Incheon (KR); Jin-myung Kim, Goyang (KR); Kwang-won Lee, Incheon (KR); Kyoung-deok Kim, Bucheon (KR); Ho-cheol Jang, Bucheon (KR)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 17/447,873

(22) Filed: Sep. 16, 2021

(65) Prior Publication Data

US 2022/0005924 A1 Jan. 6, 2022

Related U.S. Application Data

(60) Division of application No. 16/722,027, filed on Dec. 20, 2019, now Pat. No. 11,133,379, which is a (Continued)

(30) Foreign Application Priority Data

May 25, 2011 (KR) ......................... 10-2011-0049796

(51) Int. Cl.
*H01L 29/06* (2006.01)
*H01L 29/78* (2006.01)
(Continued)

(52) U.S. Cl.
CPC .... *H01L 29/0634* (2013.01); *H01L 21/02381* (2013.01); *H01L 21/02532* (2013.01); (Continued)

(58) Field of Classification Search
CPC ............... H01L 29/0634; H01L 21/265; H01L 21/2253
See application file for complete search history.

(56) References Cited

U.S. PATENT DOCUMENTS 6,566,201 B1 5/2003 Blanchard
6,683,347 B1 1/2004 Fujihira
(Continued)

FOREIGN PATENT DOCUMENTS

CN 1610964 4/2005

*Primary Examiner* — Stephen M Bradley
(74) *Attorney, Agent, or Firm* — Brake Hughes Bellermann LLP

(57) ABSTRACT

A semiconductor device having a super junction and a method of manufacturing the semiconductor device capable of obtaining a high breakdown voltage are provided, whereby charge balance of the super junction is further accurately controlled in the semiconductor device that is implemented by an N-type pillar and a P-type pillar. The semiconductor device includes a semiconductor substrate; and a blocking layer including a first conductive type pillar and a second conductive type pillar that extend in a vertical direction on the semiconductor substrate and that are alternately arrayed in a horizontal direction, wherein, in the blocking layer, a density profile of a first conductive type dopant may be uniform in the horizontal direction, and the density profile of the first conductive type dopant may vary in the vertical direction.

10 Claims, 37 Drawing Sheets

Related U.S. Application Data division of application No. 15/454,861, filed on Mar. 9, 2017, now abandoned, which is a continuation of application No. 13/354,139, filed on Jan. 19, 2012, now abandoned.

(51) Int. Cl.

| | | |
|---|---|---|
| *H01L 29/08* | (2006.01) | |
| *H01L 21/02* | (2006.01) | |
| *H01L 29/10* | (2006.01) | |
| *H01L 29/66* | (2006.01) | |
| *H01L 21/225* | (2006.01) | |
| *H01L 21/265* | (2006.01) | |
| *H01L 21/324* | (2006.01) | |

(52) U.S. Cl.
CPC .... *H01L 21/02634* (2013.01); *H01L 21/2253* (2013.01); *H01L 21/26513* (2013.01); *H01L 21/324* (2013.01); *H01L 29/0688* (2013.01); *H01L 29/0696* (2013.01); *H01L 29/0878* (2013.01); *H01L 29/0886* (2013.01); *H01L 29/1095* (2013.01); *H01L 29/66712* (2013.01); *H01L 29/7811* (2013.01); *H01L 29/7827* (2013.01); *H01L 29/0619* (2013.01)

(56) References Cited

U.S. PATENT DOCUMENTS

| | | |
|---|---|---|
| 2001/0028083 A1 | 10/2001 | Onishi et al. |
| 2002/0063259 A1 | 5/2002 | Usui et al. |
| 2003/0132450 A1 | 7/2003 | Minato et al. |
| 2003/0148559 A1 | 8/2003 | Onishi et al. |
| 2006/0006458 A1 | 1/2006 | Motai et al. |
| 2008/0246079 A1 | 10/2008 | Saito et al. |
| 2008/0246084 A1 | 10/2008 | Ono et al. |
| 2009/0079002 A1 | 3/2009 | Lee et al. |
| 2009/0236680 A1 | 9/2009 | Wilmeroth et al. |
| 2010/0078775 A1 | 4/2010 | Mauder et al. |
| 2011/0068397 A1 | 3/2011 | Disney |
| 2011/0101446 A1 | 5/2011 | Guan et al. |
| 2011/0233656 A1 | 9/2011 | Ohta et al. |
| 2012/0248566 A1 | 10/2012 | Bobde et al. |
| 2012/0273916 A1 | 11/2012 | Yedinak et al. |

SEMICONDUCTOR DEVICE HAVING A SUPER JUNCTION STRUCTURE AND METHOD OF MANUFACTURING THE SAME

CROSS-REFERENCE TO RELATED APPLICATIONS

This application is a divisional of U.S. application Ser. No. 16/722,027, filed Dec. 20, 2019, now U.S. Pat. No. 11,133,379, issued on Sep. 28, 2021, which is a divisional of U.S. application Ser. No. 15/454,861, filed Mar. 9, 2017, which is a continuation of U.S. application Ser. No. 13/354,139, filed Jan. 19, 2012, which claims the benefit of Korean Patent Application No. 10-2011-0049796, filed on May 25, 2011, in the Korean Intellectual Property Office. The aforementioned disclosures are incorporated herein by reference in their entirety.

BACKGROUND

The inventive concept relates to a semiconductor device, and more particularly, to a high-voltage power semiconductor device having a super junction structure and a method of manufacturing the same.

In general, a high-voltage power semiconductor device such as a metal-oxide-semiconductor field-effect transistor (MOSFET) and an insulated gate bipolar transistor (IGBT) includes a source region and a drain region that are respectively formed on a top surface and a bottom surface of a drift region. Also, the high-voltage power semiconductor device includes a gate insulating layer on the top surface of the drift region, which is adjacent to the source region, and includes a gate electrode formed on the gate insulating layer.

In a turn-on status of the high-voltage power semiconductor device, the drift region provides a conductive path with respect to a drift current flowing from the drain region to the source region, and in a turn-off status of the high-voltage power semiconductor device, the drift region provides a depletion region that expands in a vertical direction due to a received reverse bias voltage. According to a characteristic of the depletion region provided by the drift region, a breakdown voltage of the high-voltage power semiconductor device is determined.

In order to minimize a conduction loss occurring in the turn-on status of the high-voltage power semiconductor device and to assure fast switching speeds, research has been conducted to decrease a resistance of the drift region that provides the conductive path in the turn-on status. In general, it is known that a turn-on resistance of the drift region can be decreased by increasing an impurity density in the drift region.

However, when the impurity density in the drift region is increased, space charges are increased in the drift region such that a breakdown voltage is decreased. Recently, in order to solve this problem, a high-voltage power semiconductor device having a new junction structure referred to as super junction has been presented so as to decrease a resistance in a turn-on status and simultaneously to assure a high breakdown voltage.

FIG. 1 is a cross-sectional view of a high-voltage power semiconductor device 100 having a super junction structure, according to the related art.

Referring to FIG. 1, the high-voltage power semiconductor device 100 has a super junction structure in which an N-type pillar 21 and a P-type pillar 22 alternate with each other in a horizontal direction, wherein the N-type pillar 21 is an N-type impurity region and the P-type pillar 22 is a P-type impurity region which extend in a vertical direction in a semiconductor layer 60 formed on a semiconductor substrate 10. A P-type well region 30 having low density, that is, a body layer, is formed on an upper portion of the super junction structure, and a source region 40 formed of a high density N-type (N$^+$) impurity is formed on an upper portion of the well region 30 on the semiconductor layer 60. A source electrode S is electrically connected to the source region 40. Also, the high-voltage power semiconductor device 100 includes a gate stack 50, including a gate insulating layer 51 and a gate electrode 52 on a top surface of the semiconductor layer 60, which is adjacent to the source region 40. The semiconductor substrate 10 disposed on a bottom surface of the semiconductor layer 60 is connected to a drain electrode D.

When the high-voltage power semiconductor device 100 is turned on, the N-type pillar 21 provides a conductive path to charges flowing from the source electrode S to the drain electrode D via a channel formed below the gate stack 50. When the high-voltage power semiconductor device 100 is turned off, the N-type pillar 21 and the P-type pillar 22 deplete each other due to a reverse bias voltage, so that the high-voltage power semiconductor device 100 has a sufficiently high breakdown voltage characteristic.

In particular, when a charge quantity of the N-type pillar 21 and a charge quantity of the P-type pillar 22 balance, the N-type pillar 21 and the P-type pillar 22 are fully depleted in a turn-off status, so that they may function as ideal insulators. In consideration of a super junction unit U (a region surrounded by dashed lines, and top and bottom solid lines) that is formed of ½ of the N-type pillar 21 and ½ of the P-type pillar 22 adjacent to the N-type pillar 21, they are required to satisfy Equation 1 so as to balance the charge quantity of the N-type pillar 21 and the charge quantity of the P-type pillar 22.

$$Nn \times \tfrac{1}{2}Wn = Np \times \tfrac{1}{2}Wp \qquad \text{Equation (1)}$$

where Nn and Np respectively indicate impurity densities of the N-type pillar 21 and the P-type pillar 22, and Wn and Wp respectively indicate widths of the N-type pillar 21 and the P-type pillar 22.

When the charge quantity of the N-type pillar 21 and the charge quantity of the P-type pillar 22 balance, as described above, a breakdown voltage may be determined by multiplying a height H of the super junction unit U by an electric field generated between the super junction units U. As a result, although a resistance of a device is decreased by increasing the impurity density of the N-type pillar 21, a specific resistance of the N-type pillar 21 does not affect the breakdown voltage, so that it is possible to obtain a high breakdown voltage.

SUMMARY

The inventive concept provides a semiconductor device having a super junction and a method of manufacturing the semiconductor device capable of obtaining a high breakdown voltage, whereby charge balance of the super junction is further accurately controlled in the semiconductor device that is implemented with an N-type pillar and a P-type pillar.

According to an aspect of the inventive concept, there is provided a semiconductor device having a super junction, the semiconductor device including a semiconductor substrate; and a blocking layer comprising a first conductive type pillar and a second conductive type pillar that extend in a vertical direction on the semiconductor substrate and that are alternately arrayed in a horizontal direction, wherein, in the blocking layer, a density profile of a first conductive type dopant is uniform in the horizontal direction, and the density profile of the first conductive type dopant varies in the vertical direction.

The density profile of the first conductive type dopant may vary in the vertical direction according to a predetermined period. For example, a high-density portion and a low-density portion in the density profile of the first conductive type dopant may be repeated in the vertical direction.

A side surface of the first conductive type pillar and a side surface of the second conductive type pillar may contact each other, whereby the side surfaces may have opposite curves.

The semiconductor device may further include a first conductive type epi-layer formed on the semiconductor substrate.

The semiconductor device may further include a gate insulating layer formed on the first conductive type pillar; a gate electrode formed on the gate insulating layer; a body layer formed in an upper region of the second conductive type pillar; at least one source region formed in the body layer; and a source electrode formed on the body layer and electrically connected to the at least one source region, wherein the body layer is formed at both sides below the gate electrode, and both end portions of the gate electrode overlap with a portion of the body layer.

The first and second conductive type pillars may include a horizontal cross-section structure including a stripe structure, a circular structure, or a cellular structure in which the first conductive type pillar surrounds the second conductive type pillar.

The semiconductor device may further include a termination first conductive type pillar and a termination second conductive type pillar that are formed on the semiconductor substrate outside a region in which the blocking layer is formed.

According to another aspect of the inventive concept, there is provided a semiconductor device having a super junction, the semiconductor device including a semiconductor substrate; and a blocking layer comprising a first conductive type pillar and a second conductive type pillar that are alternately arrayed in a horizontal direction on the semiconductor substrate, wherein, in the blocking layer, first conductive type dopant density varies according to heights in a vertical direction, and the first conductive type dopant density is uniform in the horizontal direction at the same height.

According to another aspect of the inventive concept, there is provided a method of manufacturing a semiconductor device having a super junction, the method including the operations of preparing a semiconductor substrate; and forming a blocking layer comprising a first conductive type pillar and a second conductive type pillar that extend in a vertical direction on the semiconductor substrate and that are alternately arrayed in a horizontal direction, wherein the blocking layer is formed by performing a whole surface-implanting operation by using a first conductive type dopant.

Due to the whole surface-implanting operation, a density profile of the first conductive type dopant may be uniform in the horizontal direction in the blocking layer.

The operation of forming the blocking layer may include the operations of forming a stack epi-layer on the semiconductor substrate, wherein the stack epi-layer comprises at least two undoped epi-layers, and a first conductive type implant layer and a second conductive type implant layer that are formed on an upper region of at least one of the at least two undoped epi-layers; and forming the first conductive type pillar and the second conductive type pillar by diffusing a dopant of the first conductive type implant layer and a dopant of the second conductive type implant layer to the at least two undoped epi-layers by performing a thermal treatment.

Due to the operation of diffusing, a density profile of the first conductive type dopant may vary in the vertical direction in the blocking layer. For example, a high-density portion and a low-density portion in the density profile of the first conductive type dopant may be repeated in the vertical direction.

The operation of forming the stack epi-layer may include the operations of forming an undoped epi-layers on the semiconductor substrate; forming the first conductive type implant layer by implanting a first conductive type dopant in entire top surfaces of the undoped epi-layers; forming the second conductive type implant layer by implanting a second conductive type dopant in a predetermined portion of the first conductive type implant layer; and repeating the forming of the undoped epi-layers through the forming of the second conductive type implant layer.

The method may further include one of the operations of forming an undoped epi-layer or a first conductive type epi-layer on the first and second conductive type implant layers that are uppermost layers; sequentially forming the undoped epi-layer and the first conductive type epi-layer on the first and second conductive type implant layers that are the uppermost layers; and forming a top undoped epi-layer on the first and second conductive type implant layers that are the uppermost layers, and then implanting a first conductive type dopant in an upper region of the top undoped epi-layer. Also, a thickness of at least one undoped epi-layer from among a plurality of the undoped epi-layers may be different, or one of first and second conductive type implant layers having different dopant density may be formed in at least one undoped epi-layer from among a plurality of the undoped epi-layers.

The method may further include the operation of forming a first conductive type epi-layer on the semiconductor substrate.

A thickness and an amount of dopant of each of the first conductive type implant layer and the second conductive type implant layer may be defined according to Equation 1 below for the super junction $$Nn \times \tfrac{1}{2} Wn = Np \times \tfrac{1}{2} Wp \qquad \text{Equation (1)}$$

where Nn and Np may respectively indicate impurity densities of the first conductive type pillar and the second conductive type pillar, and Wn and Wp may respectively indicate widths of the first conductive type pillar and the second conductive type pillar.

Also, a thickness of at least one undoped epi-layer from among a plurality of the undoped epi-layers may be different, or one of first and second conductive type implant layers having different dopant density may be formed in at least one undoped epi-layer from among a plurality of the undoped epi-layers.

The method may further include the operations of forming a gate oxide layer on the first conductive type pillar; forming a gate electrode on the gate oxide layer; forming a body layer in an upper region of the second conductive type pillar; forming at least one source region in the body layer; and forming a source electrode electrically connected to the at least one source region.

The semiconductor substrate may be divided into an active region and a termination region that surrounds the active region, and the operation of forming the blocking layer may include the operation of forming a termination first conductive type pillar and a termination second conductive type pillar on the semiconductor substrate of the termination region.

According to another aspect of the inventive concept, there is provided a method of manufacturing a semiconductor device having a super junction, the method including the operations of preparing a semiconductor substrate; forming an undoped epi-layer on the semiconductor substrate; forming a first conductive type implant layer by implanting a first conductive type dopant in an entire top surface of the undoped epi-layer; forming a second conductive type implant layer by implanting a second conductive type dopant in a predetermined portion of the first conductive type implant layer; repeating the operation of forming the undoped epi-layer through the operation of forming the second conductive type implant layer; and forming a first conductive type pillar and a second conductive type pillar by diffusing a dopant of the first conductive type implant layer and a dopant of the second conductive type implant layer to the undoped epi-layer by performing a thermal treatment.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
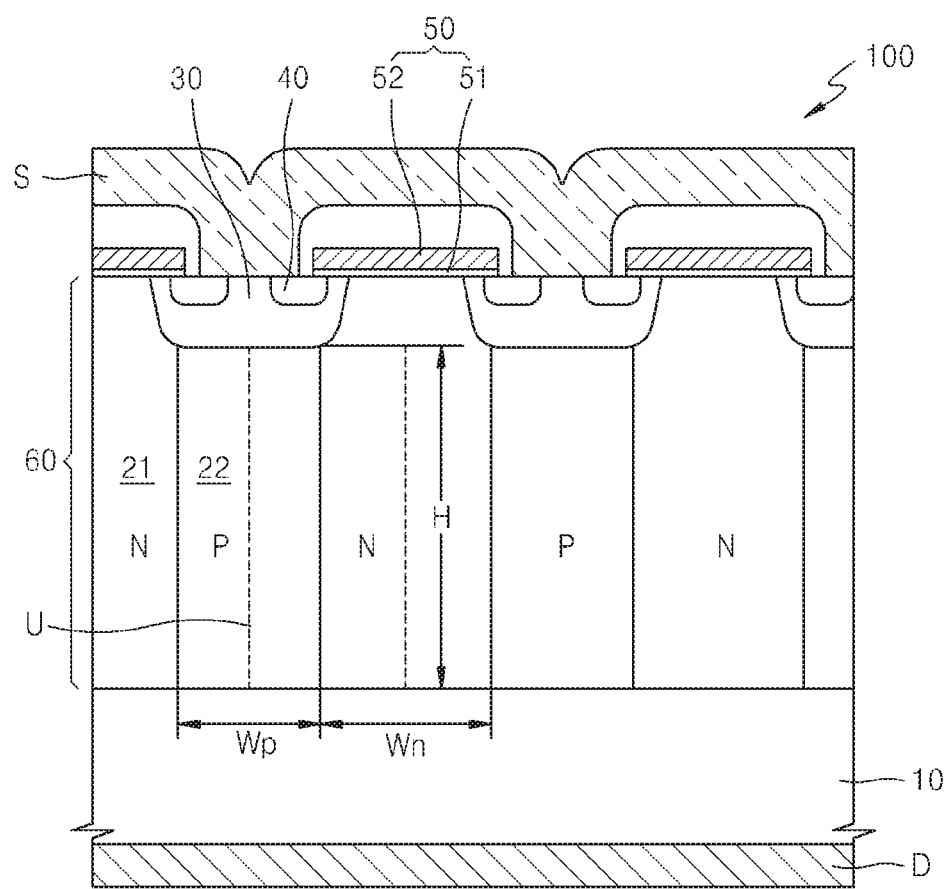
FIG. 1 is a cross-sectional view of a high-voltage power semiconductor device having a super junction structure, according to the related art.

Hereinafter, the inventive concept will be described in detail by explaining exemplary embodiments of the inventive concept with reference to the attached drawings. Throughout the specification, it will also be understood that when an element is referred to as being "on" another element, it can be directly on the other element, or intervening elements may also be present. In the drawings, the thicknesses or sizes of elements are exaggerated for clarity, and in the following description, functions or constructions that are not related to the inventive concept are not described. Like reference numerals in the drawings denote like elements. The terms or words used in the following description should not be construed as limiting the spirit and scope of the following claims but should be construed as describing the inventive concept.

Figure 2A:
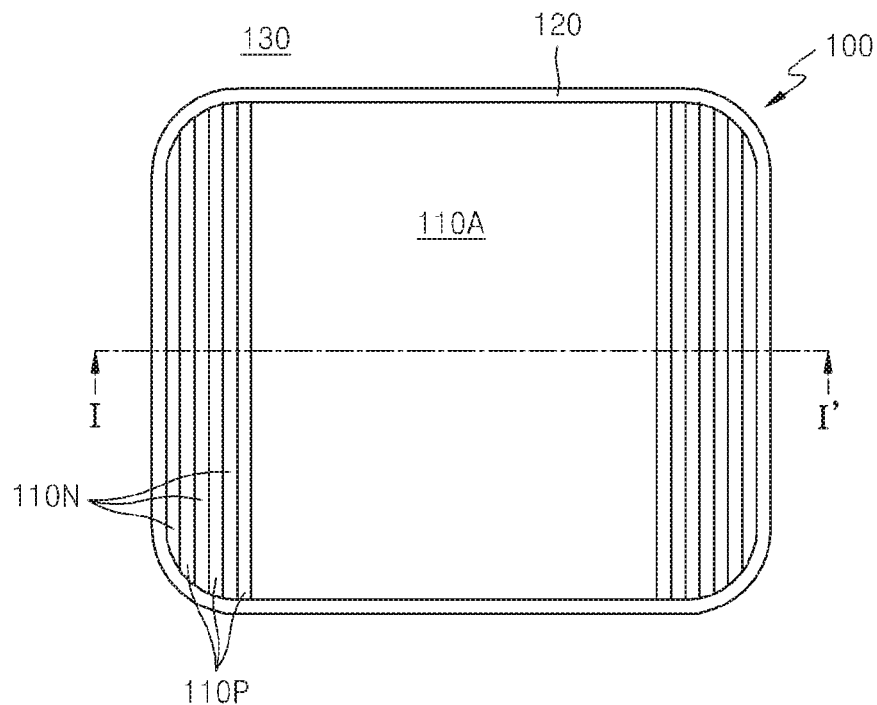
FIGS. 2A and 2B are layout diagrams illustrating semiconductor devices having a super junctions, according to embodiments of the inventive concept.
Figure 2B:
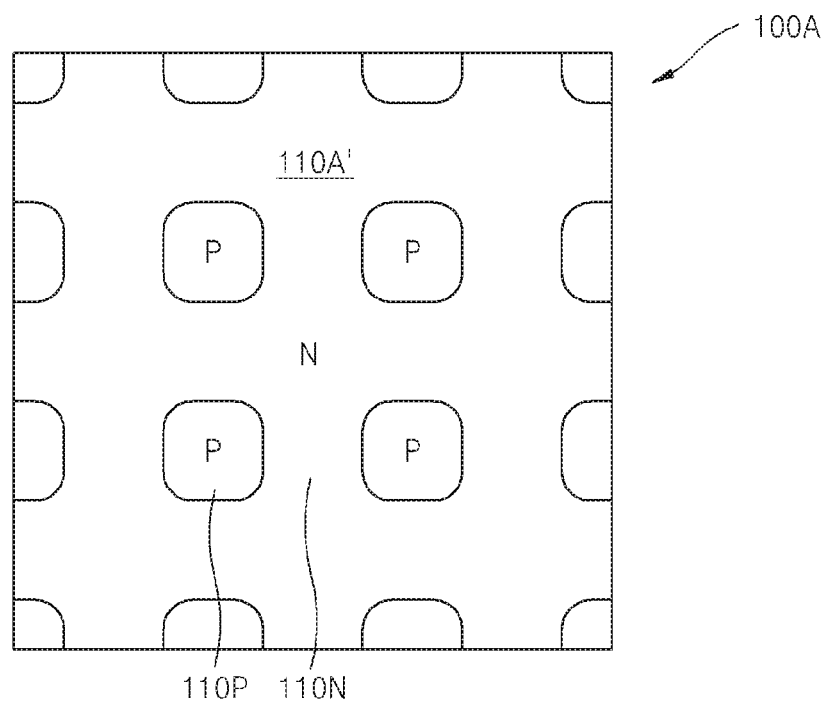

FIGS. 2A and 2B are layout diagrams illustrating semiconductor devices 100 and 100A having super junctions, according to embodiments of the inventive concept.

Referring to FIG. 2A, the semiconductor device having super junction 100 (hereinafter, referred to as 'semiconductor device 100') may be broadly divided into an active region 110A and a termination region 130. By using an edge P-type pillar 120 as a boundary, the active region 110A may be surrounded by the edge P-type pillar 120, and the edge P-type pillar 120 may be surrounded by the termination region 130.

As illustrated in FIG. 2A, the edge P-type pillar 120 may have a quadrangular ring shape having round corners. However, a shape of the edge P-type pillar 120 is not limited to the quadrangular ring shape, and may have one of various shapes according to a shape of the active region 110A. For example, the edge P-type pillar 120 may have one of various shapes including a circular shape, an oval shape, a rectangular shape, an octagonal shape, and the like.

In the active region 110A, a plurality of P-type pillars 110P and a plurality of N-type pillars 110N may be alternately disposed in a horizontal direction of FIG. 2A. Also, each of the P-type and N-type pillars 110P and 110N may have a stripe shape extending in a vertical direction in FIG. 2A. However, a structure of the P-type and N-type pillars 110P and 110N in the active region 110A may not be limited to a stripe structure of the present embodiment in which the P-type and N-type pillars 110P and 110N are alternately disposed in one direction, and thus, may vary. For example, the P-type and N-type pillars 110P and 110N may be alternately disposed in a circular ring structure or an oval ring structure.

Although not illustrated in FIG. 2A, in the termination region 130, a plurality of termination P-type pillars (not shown) and a plurality of termination N-type pillars (not shown) having the same shape as the edge P-type pillar 120 may be alternately disposed to surround the edge P-type pillar 120, as will be described in detail with reference to FIG. 4.

The P-type and N-type pillars of the active region 110A and the termination region 130 in the semiconductor device 100 may be formed by forming an undoped epi-layer and then by whole surface-implanting an N-type dopant. By using the undoped epi-layer forming and N-type dopant whole surface-implanting method, charge balance of the super junction may be further accurately controlled. A process of forming the P-type and N-type pillars will be described in detail with reference to FIGS. 9A through 9U.

Referring to FIG. 2B, a semiconductor device 100A having a super junction may have a cellular structure in which P-type pillars 110P may be cylindrically formed among N-type pillars 110N in an active region 110A'. In other words, the N-type pillars 110N may be integrated on a substrate (not shown), and the P-type pillars 110P having a cylindrical shape may be formed among the N-type pillars 110N.

In FIG. 2B, a cross-sectional structure of a portion having the P-type pillars 110P may be the same as a cross-sectional structure of the semiconductor device 100 of FIG. 2A, taken along a line I-I'.

Figure 3:
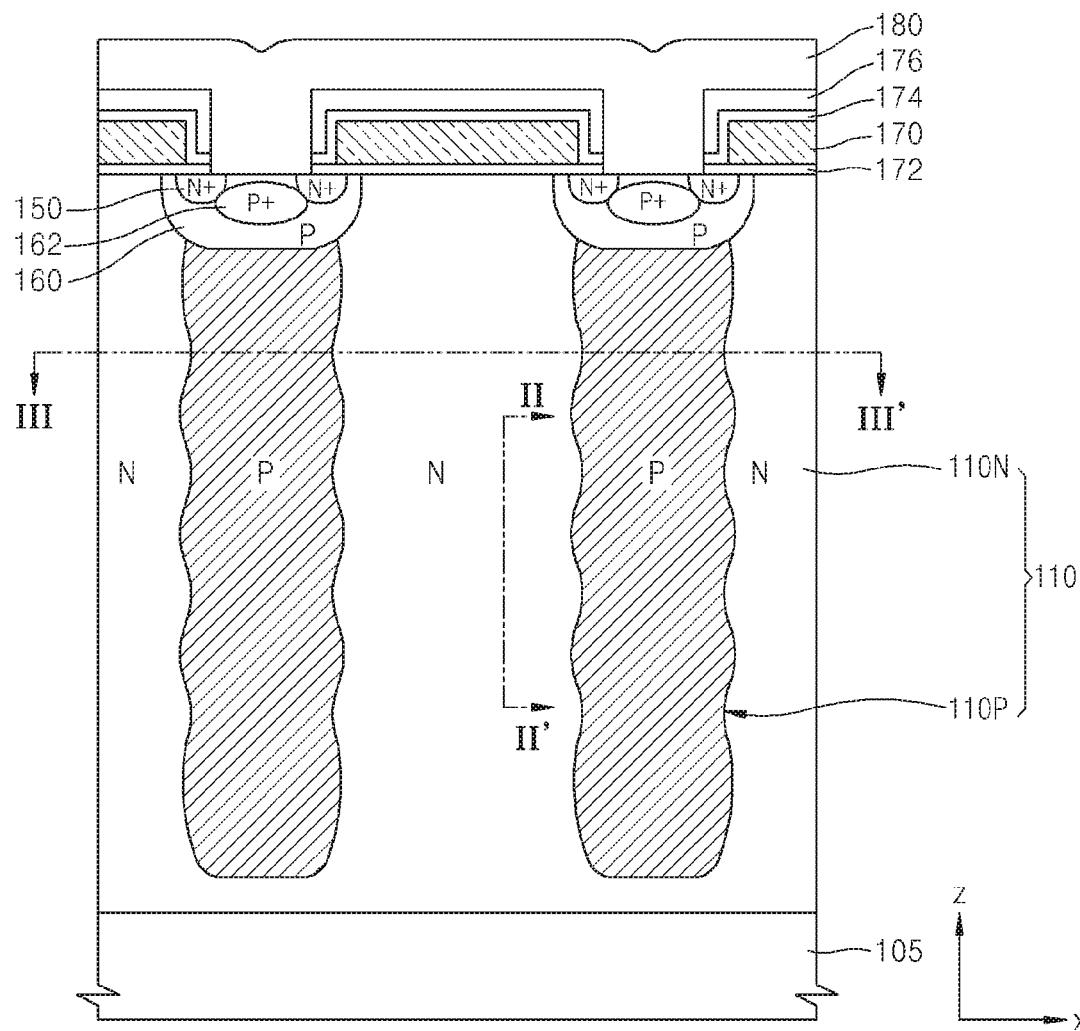
FIG. 3 is a cross-sectional view illustrating an active region taken along a line I-I' of FIG. 2A.

FIG. 3 is a cross-sectional view illustrating the active region 110A taken along a line I-I' of FIG. 2A.

Referring to FIG. 3, the semiconductor device 100 may include a semiconductor substrate 105, a blocking layer 110, a source region 150, a gate electrode 170, and a source electrode 180.

The semiconductor substrate 105 may include a group IV semiconductor substrate, a group III-V compound semiconductor substrate, or a group II-VI oxide semiconductor substrate. For example, the group IV semiconductor substrate may include a silicon substrate, a germanium substrate, or a silicon-germanium substrate. The semiconductor substrate 105 may include a bulk wafer or an epi-layer. In the present embodiment, the semiconductor substrate 105 may be a high density N-type (N$^+$) substrate.

The blocking layer 110 is a layer in which a super junction is formed, and may be referred to as a drift region because it is a path of a drift current. The blocking layer 110 may include the plurality of N-type pillars 110N and the plurality of P-type pillars 110P which are alternately arranged in a horizontal direction (an X-direction). The N-type and P-type pillars 110N and 110P may extend in a vertical direction (a Z-direction) on the semiconductor substrate 105 and may have curves that are opposite to each other in respective contact surfaces. That is, the N-type and P-type pillars 110N and 110P may be formed in the vertical direction while they contact each other, and thus, a side surface curve of the N-type pillar 110N is opposite to a side surface curve of the P-type pillar 110P.

Although not illustrated in FIG. 3, the N-type pillar 110N may be divided into an N-type implant layer (not shown) for supplying an N-type dopant, and an N-type diffusion layer (not shown) that is a diffusion region. Also, the P-type pillar 110P may be divided into a P-type implant layer (not shown) for supplying a P-type dopant, and a P-type diffusion layer (not shown) that is a diffusion region. The division of the N-type implant layer and the N-type diffusion layer in the N-type pillar 110N, or the division of the P-type implant layer and the P-type diffusion layer in the P-type pillar 110P may be dependent upon a profile difference of the N-type dopant or the P-type dopant in the vertical direction (a Z-direction). In other words, the N-type implant layer may have higher N-type dopant density, compared to the N-type diffusion layer. Also, the P-type implant layer may have higher P-type dopant density than the P-type diffusion layer The profile of the N-type dopant with respect to the blocking layer 110 in a horizontal direction (an X-direction) and the vertical direction (a Z-direction) may be described in detail with reference to graphs of FIGS. 5 and 6. Also, the division of the N-type implant layer and the N-type diffusion layer in the N-type pillar 110N, or the division of the P-type implant layer and the P-type diffusion layer in the P-type pillar 110P may become clear with reference to FIGS. 9A through 9U describing a semiconductor device manufacturing process.

A structure of the super junction formed of the N-type pillar 110N and the P-type pillar 110P may have a height of several tens to several hundreds of micrometers in the vertical direction, and may have a width of several tens of micrometers in the horizontal direction.

The source region 150 may be formed in a semiconductor body layer, that is, a P-type well 160 formed in an upper region of the P-type pillar 110P. The source region 150 may be a high density N-type (N$^+$) impurity region, and the P-type well 160 may have one or more source regions 150. In the present embodiment, two source regions 150 are formed in each P-type well 160. By forming two source regions 150, current paths may be respectively formed to the N-type pillars 110N at both sides of each P-type pillar 110P. In a case where the blocking layer 110 has a circular structure in which P-type pillars and N-type pillars are alternately disposed with respect to one of a P-type pillar and a N-type pillar, the source region 150 may have a ring shape.

A high density P-type impurity region 162 may be formed in a gap below two source regions 150 in each P-type well 160. The reason why the high density P-type impurity region 162 is formed is to improve an unclamped inductive switching (UIS) characteristic. When a voltage according to an avalanche current of a device approaches a built-in electrical potential of a junction of the source region 150 and the P-type well 160, a parasitic bipolar junction transistor (BJT) is turned on such that an error, which is referred to as an UIS error, occurs in the device. In order to remove the UIS error, the high density P-type impurity region 162 may be formed.

The gate electrode 170 may be formed on the N-type pillar 110N. The gate electrode 170 may be formed of an N-type poly silicon. A gate oxide layer 172 may be formed between the gate electrode 170 and the N-type pillar 110N as an insulating film.

An insulating layer may be formed on the gate electrode 170. The insulating layer may be formed for insulation from the source electrode 180 that is a metal line, and may have a plurality of layers. For example, the insulating layer may be formed of a nitride layer 174 and a Boro-Phospho Silicate Glass (BPSG) layer 176.

The source electrode 180 may be formed to contact the source region 150 and simultaneously to cover the insulating layer, namely, the nitride layer 174 and BPSG layer 176. The source electrode 180 may be formed of metal. A drain electrode (not shown) may be formed below the semiconductor substrate 105.

As described above, in the semiconductor device 100 according to the present embodiment, the N-type and P-type pillars 110N and 110P may be formed using the undoped epi-layer forming and N-type dopant whole surface-implanting method. Accordingly, the semiconductor device 100 may have a super junction structure in which charge balance may be further accurately controlled.

Figure 4:
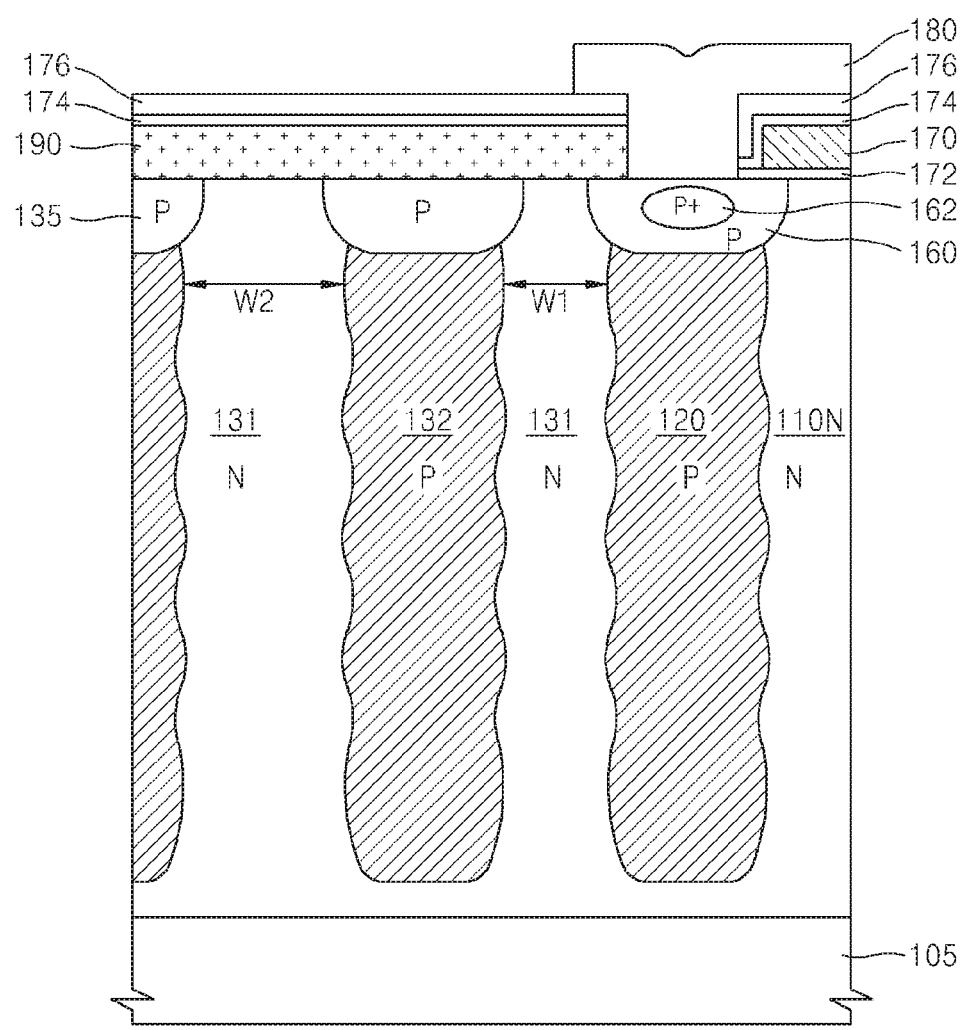
FIG. 4 is a cross-sectional view illustrating an edge of the active region and a termination region taken along a line I-I' of FIG. 2A.

FIG. 4 is a cross-sectional view illustrating an edge of the active region 110A and the termination region 130 taken along a line I-I' of FIG. 2A.

Referring to FIG. 4, in the semiconductor device 100, N-type pillars and P-type pillars may be formed in the termination region 130 in a similar manner to the active region 110A. In order to distinguish the P-type pillars from the P-type pillars 110P of the active region 110A, the P-type pillars are referred to as an edge P-type pillar 120 and a termination P-type pillar 132. Also, the N-type pillars of the termination region 130 are referred to as termination N-type pillars 131.

The edge P-type pillar 120 has the same vertical structure and a different horizontal structure, compared to the P-type pillar 110P in the active region 110A. In other words, as illustrated in FIG. 2A, the edge P-type pillar 120 may have a horizontal cross-section having a rectangular ring shape that surrounds the active region 110A. In addition, a P-type well 160 may also be formed in an upper region of the edge P-type pillar 120, and the high density P-type impurity region 162 may also be formed in the P-type well 160. The P-type well 160 may be electrically connected to the source electrode 180.

A P-type ring field 135 corresponding to the P-type well 160 of the active region 110A may be formed in an upper region of the termination P-type pillar 132. The P-type ring field 135 may have a ring shape that surrounds the active region 110A. However, in another example, the P-type ring field 135 may be omitted, and if so, the upper region of the termination P-type pillar 132 may substitute the P-type ring field 135.

Unlike the P-type well 160 of the active region 110A, a source region is not formed in the P-type ring field 135, and thus the P-type ring field 135 is not connected to the source electrode 180. Accordingly, the P-type ring field 135 may maintain its floating status. The reason why the P-type ring field 135 is formed is to prevent that electrical potential concentrates on a side surface of an outermost P-type well 160, that is, the P-type well 160 formed on the edge P-type pillar 120. In other words, in order to prevent that a breakdown voltage (BV) decreases due to the electrical potential concentration on the outermost P-type well 160, the P-type ring field 135 may be formed. A gap between the P-type ring fields 135, or a gap between the termination P-type pillars 132 may increase in an outer side. In other words, as illustrated in FIG. 4, a gap W2 between the termination P-type pillars 132 in the outer side (a left part of FIG. 4) may be greater than a gap W1 between the termination P-type pillar 132 and the edge P-type pillar 120 (a right part of FIG. 4) which is close to the active region 110A.

An insulating layer, that is, a field oxide layer 190 may be formed on the P-type ring fields 135. The insulating layer on the P-type ring fields 135 may include only the field oxide layer 190 or may further include the gate oxide layer 172, the nitride layer 174, and the BPSG layer 176. For example, as illustrated in FIG. 4, the nitride layer 174 and the BPSG layer 176 may not be patterned but may be formed on the field oxide layer 190.

In the present embodiment, the edge of the active region 110A and the termination region 130 may be formed using a process of the active region 110A. In other words, the edge P-type pillar 120 of the edge of the active region 110A, and the termination P-type pillar 132 of the termination region 130 may be formed together when the P-type pillar 110P of the active region 110A is formed. In addition, due to the existence of the field oxide layer 190, the P-type ring fields 135 may be separately formed via an ion implantation process or may be omitted, as described above.

Figure 5:
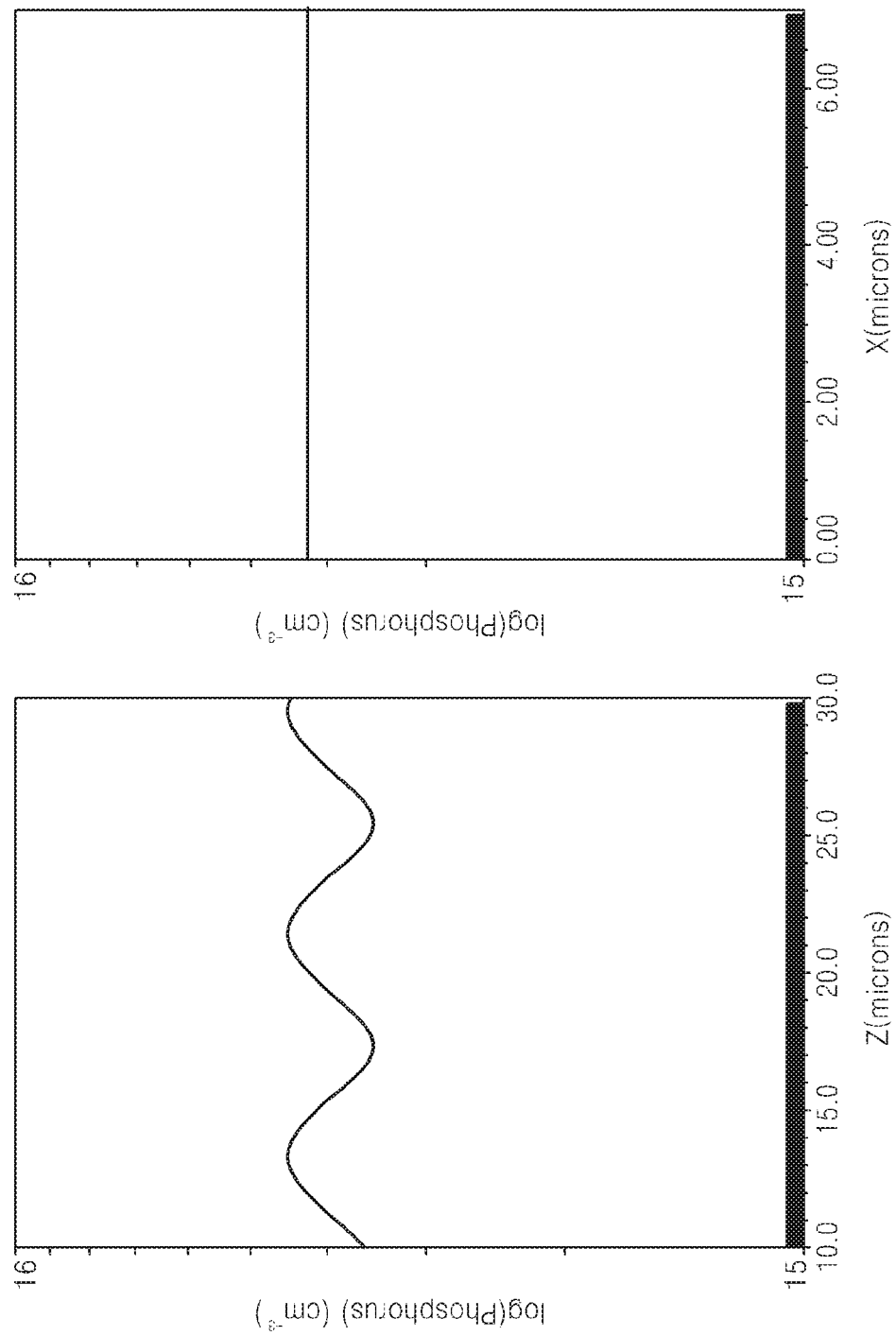
FIG. 5 illustrates graphs of an N-type dopant profile along lines II-IP and of FIG. 3.

FIG. 5 illustrates graphs of an N-type dopant profile along lines II-II' and III-III' of FIG. 3. The graph at a left side of FIG. 5 illustrates the N-type dopant profile in a vertical direction, that is, along the line II-IP, and the graph at a right side of FIG. 5 illustrates the N-type dopant profile in a horizontal direction, that is, along the line III-III'.

Referring to FIG. 5, as illustrated in the graph at the left side, in a semiconductor device, the N-type dopant profile may not be uniform in the vertical direction (a Z-direction). In other words, the density of an N-type dopant may fluctuate in the vertical direction. Also, the N-type dopant profile may vary according to a predetermined cycle. For example, as illustrated in FIG. 5, the N-type dopant profile may sinusoidally vary in the vertical direction.

A value of maximum density ($N_{peak}$)/minimum density ($N_{valley}$) of the N-type dopant in the vertical direction may be equal to or less than 100. The reason why the N-type dopant profile fluctuates in the vertical direction is that the N-type dopant of an N-type implant layer diffuses to an undoped epi-layer, so that an N-type pillar is formed. As illustrated in the graph at the right side, in the semiconductor device, the N-type dopant profile may be uniform in the horizontal direction (an X-direction). In other words, an amount of the N-type dopant per unit area may be uniform in the horizontal direction. This is because the N-type dopant is whole surface-implanted to the undoped epi-layer and then diffuses, so that the N-type pillar is formed. A variation of the N-type dopant profile in the horizontal direction may be equal to or less than 1%.

For reference, an impurity type in a P-type pillar is indicated as a P-type. However, this is because an amount of a P-type dopant is relatively greater than an amount of an N-type dopant in the P-type pillar, and the amount of the N-type dopant in the P-type pillar may be equal to an amount of the N-type dopant in the N-type pillar.

Figure 9A:
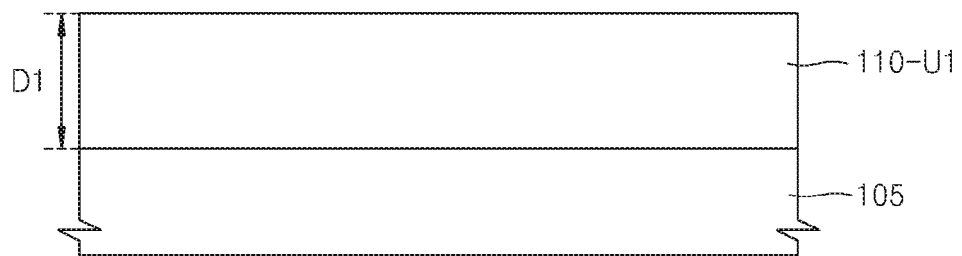
FIGS. 9A through 9U are cross-sectional views illustrating a method of manufacturing the semiconductor device of FIG. 3, according to an embodiment of the inventive concept.
Figure 9B:
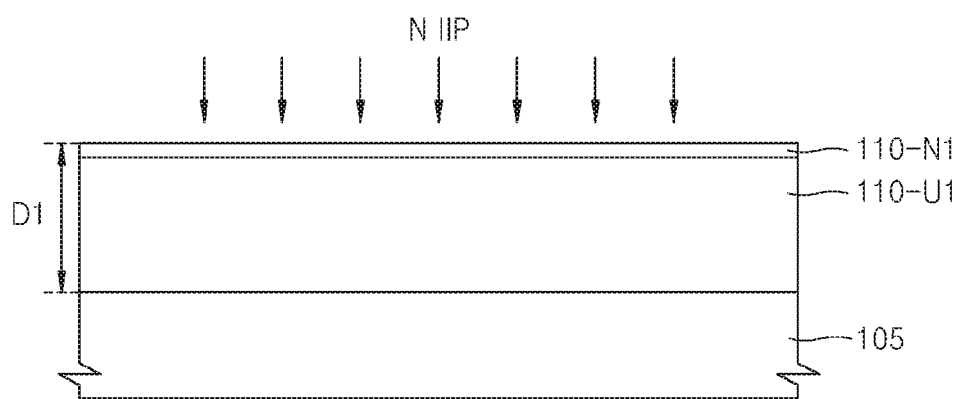
Figure 9C:
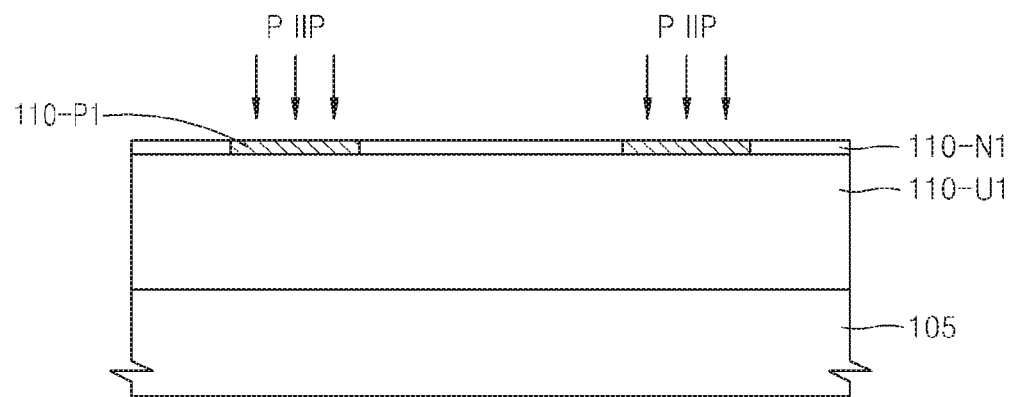
Figure 9D:
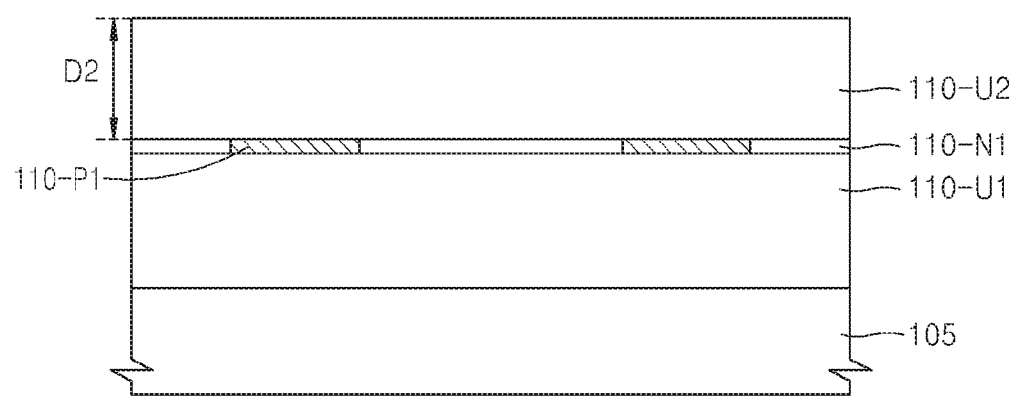
Figure 9E:
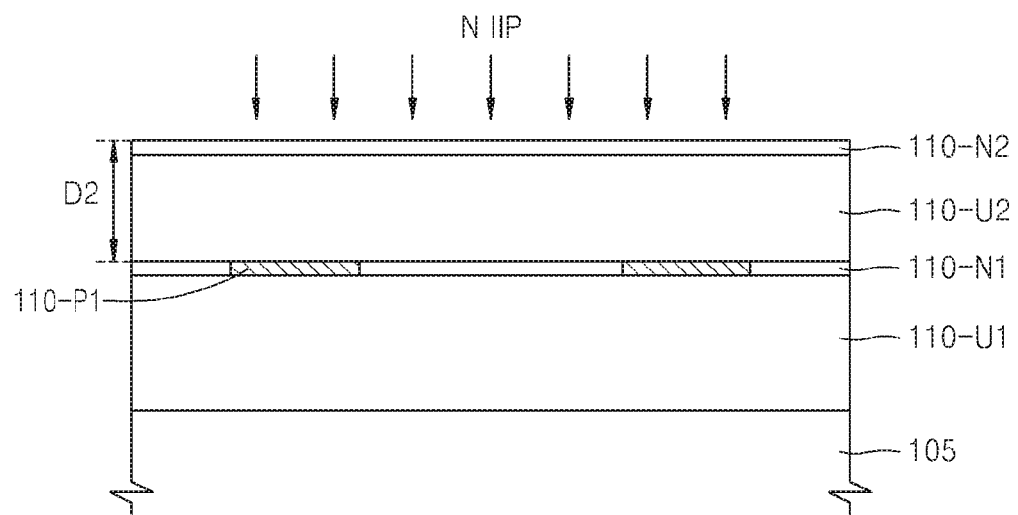
Figure 9F:
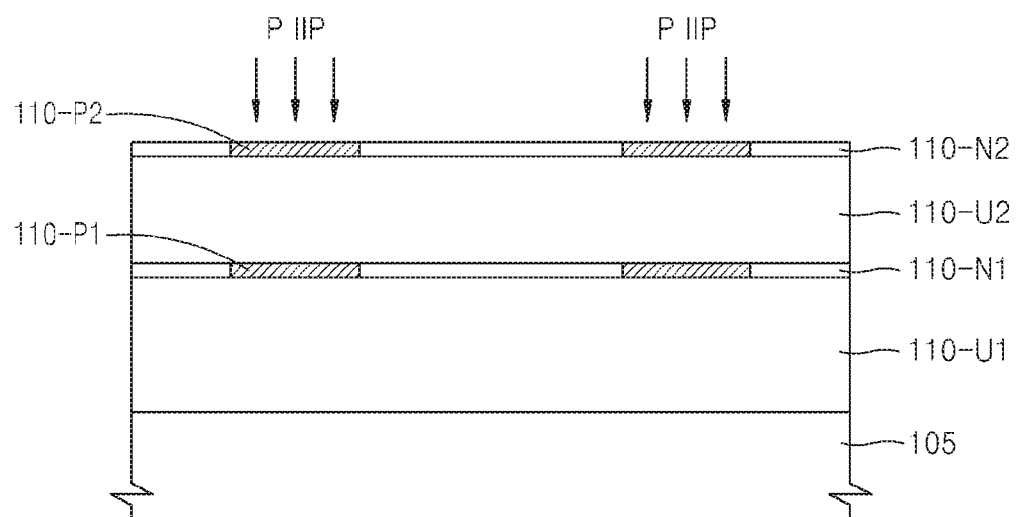
Figure 9G:
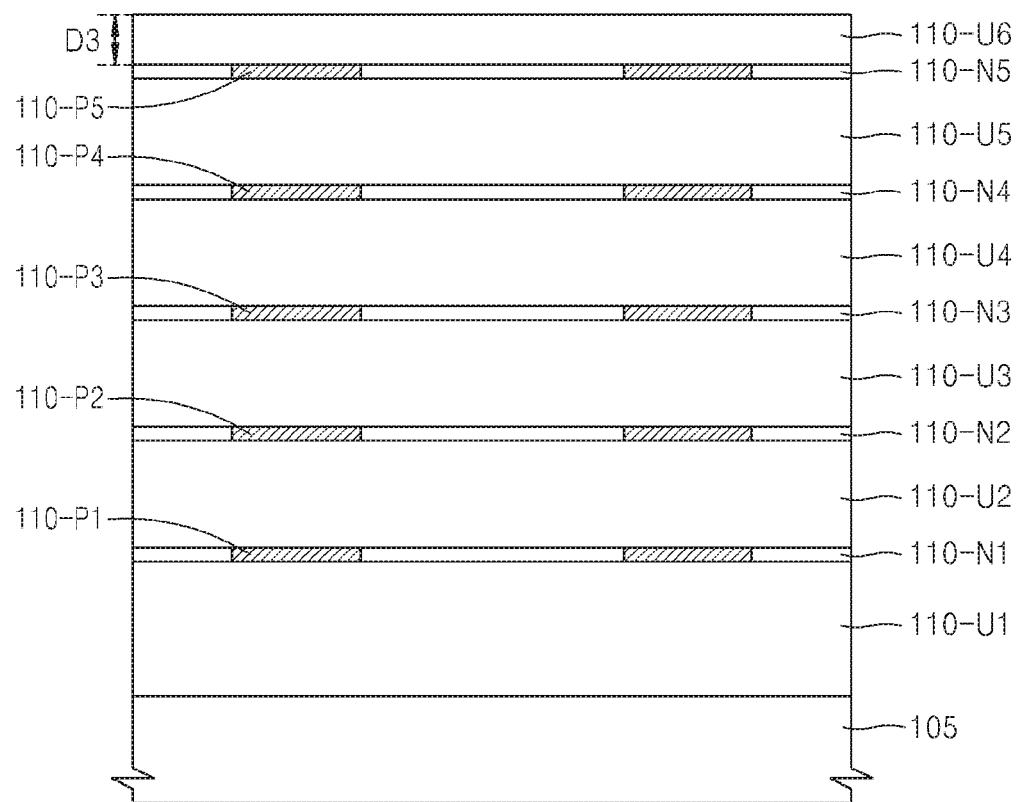
Figure 9H:
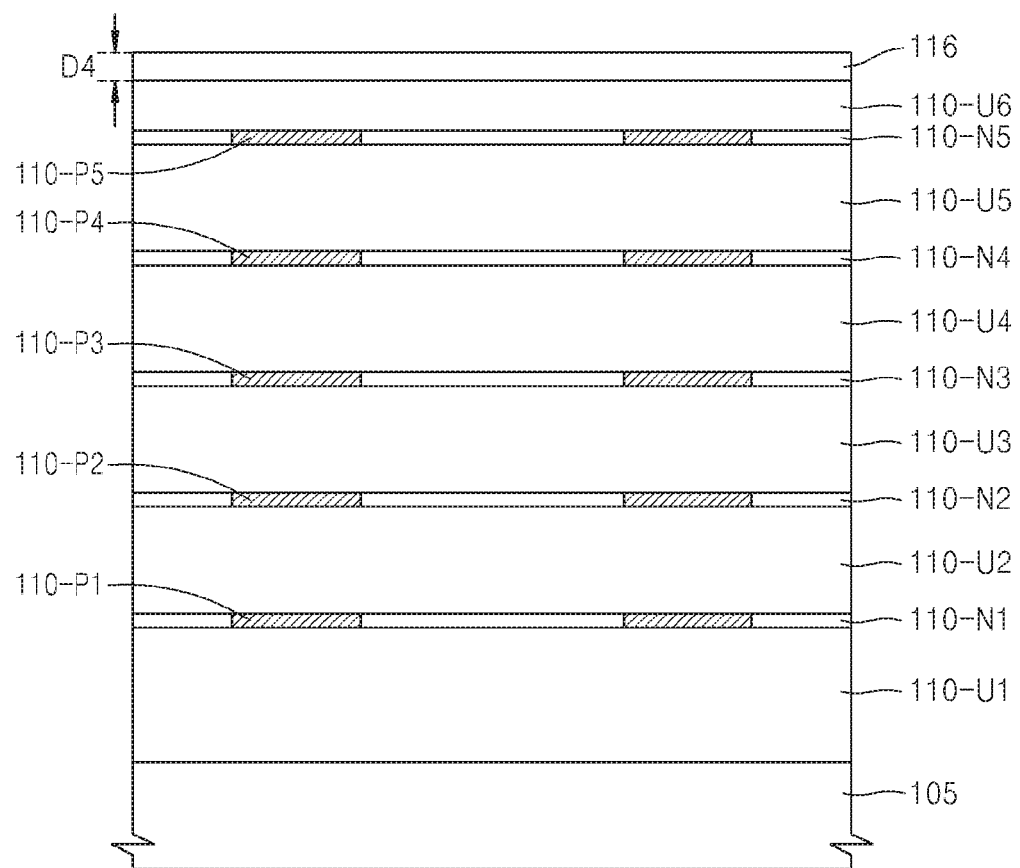
Figure 9I:
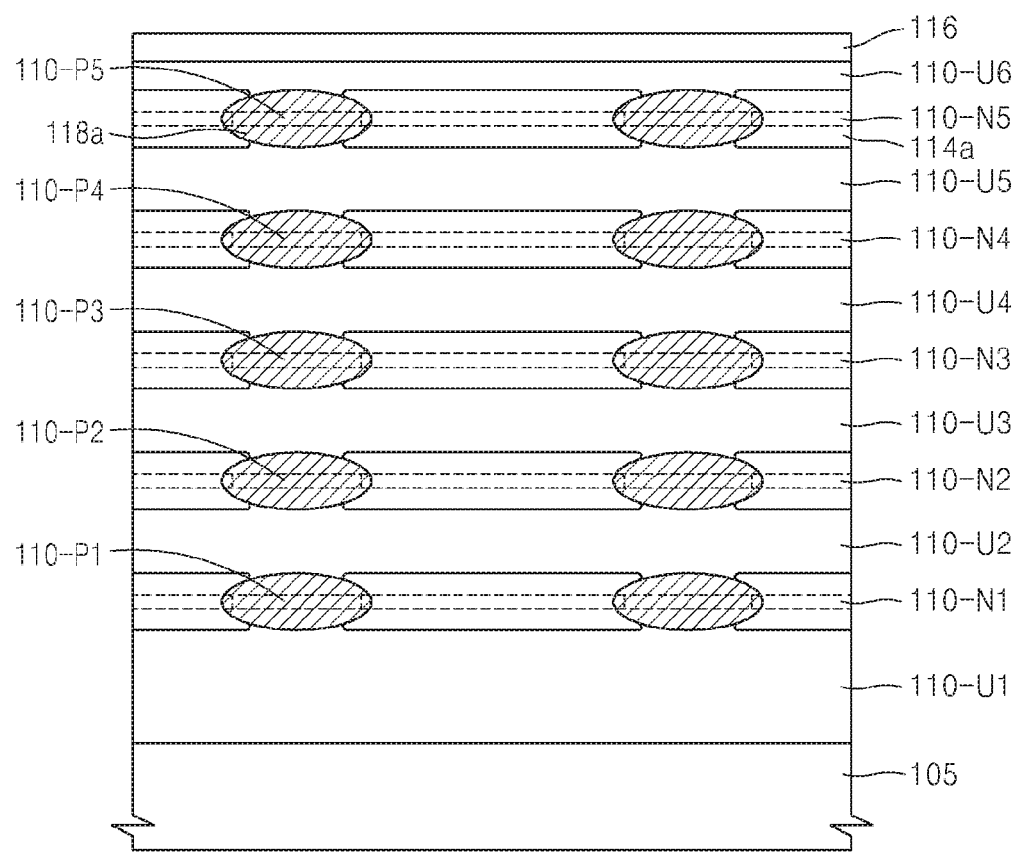
Figure 9J:
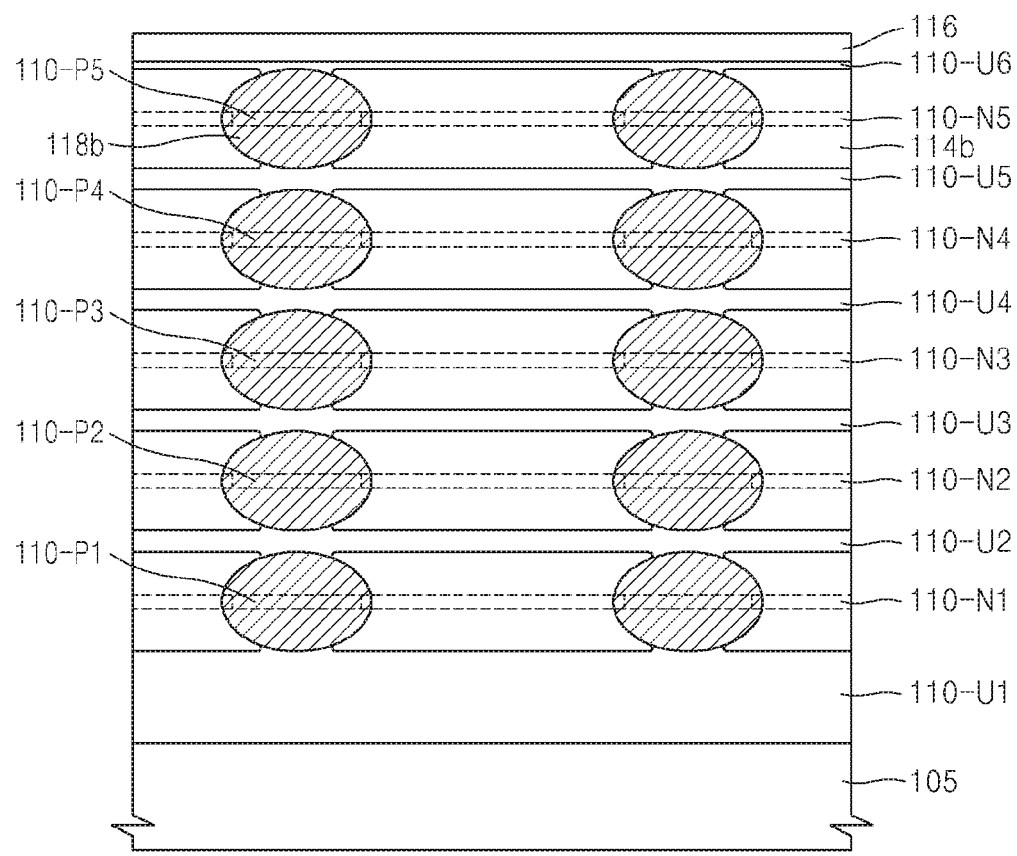
Figure 9K:
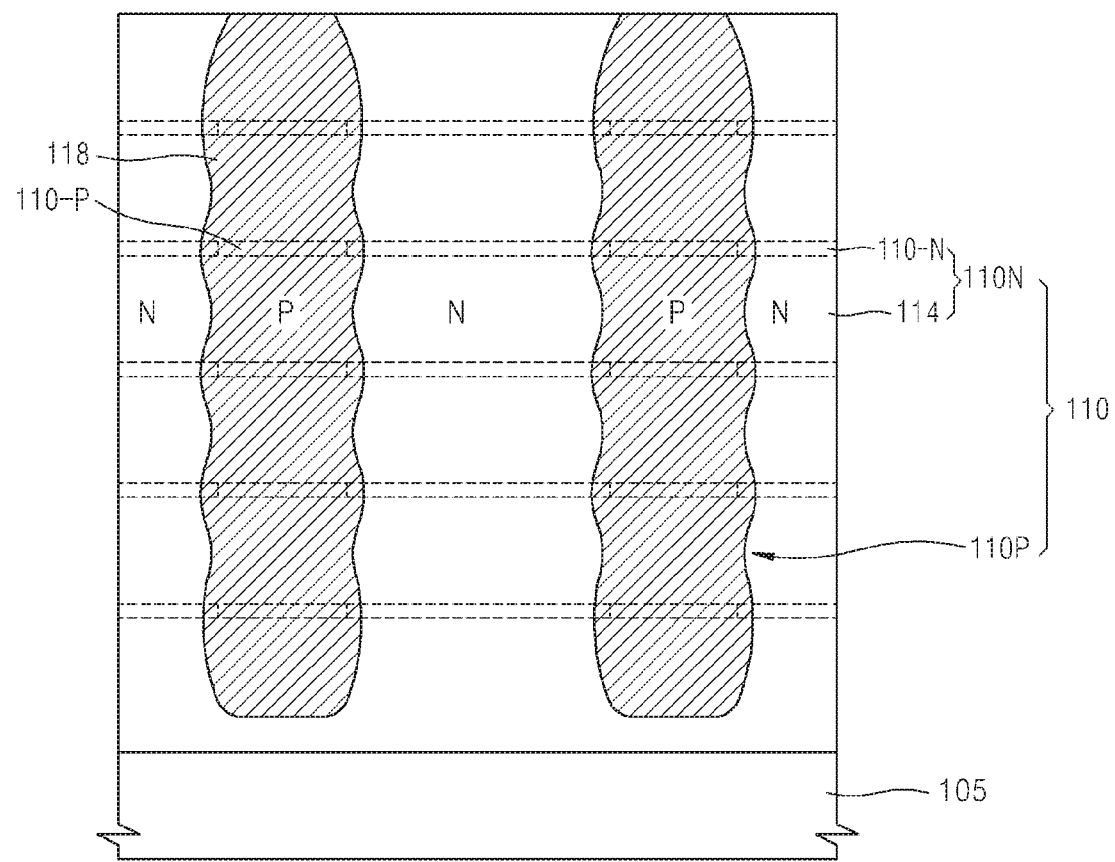
Figure 9L:
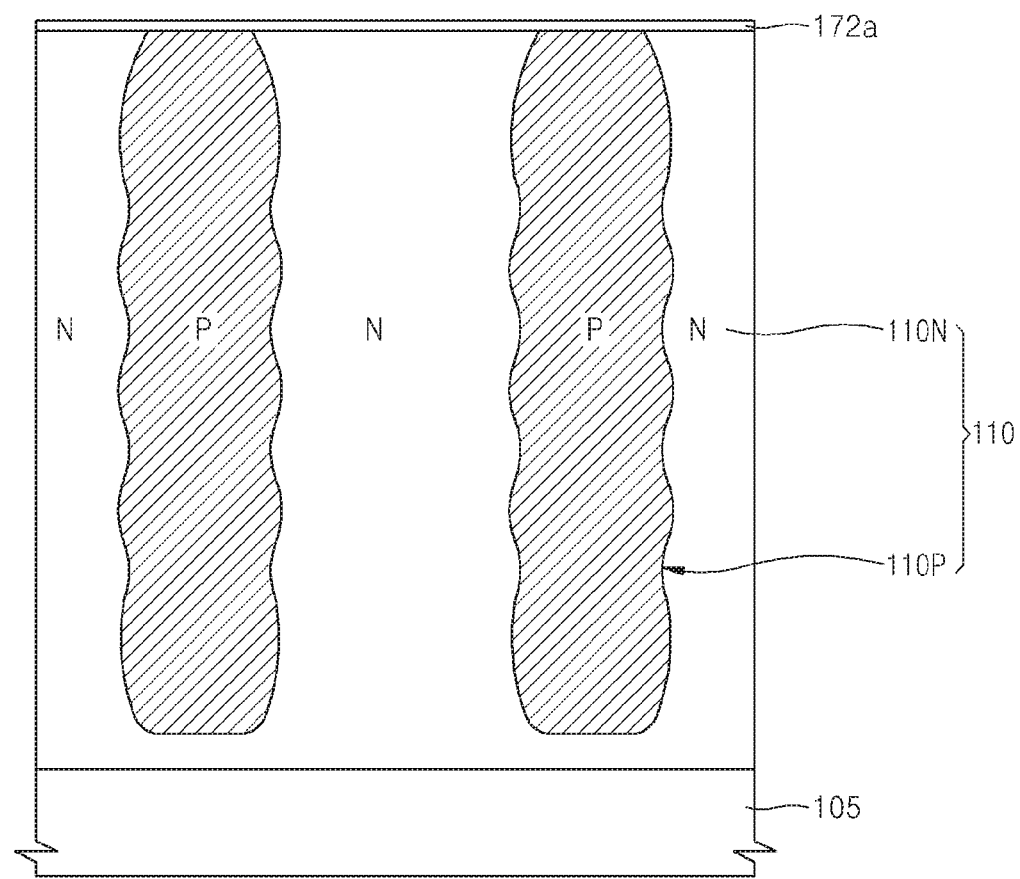
Figure 9M:
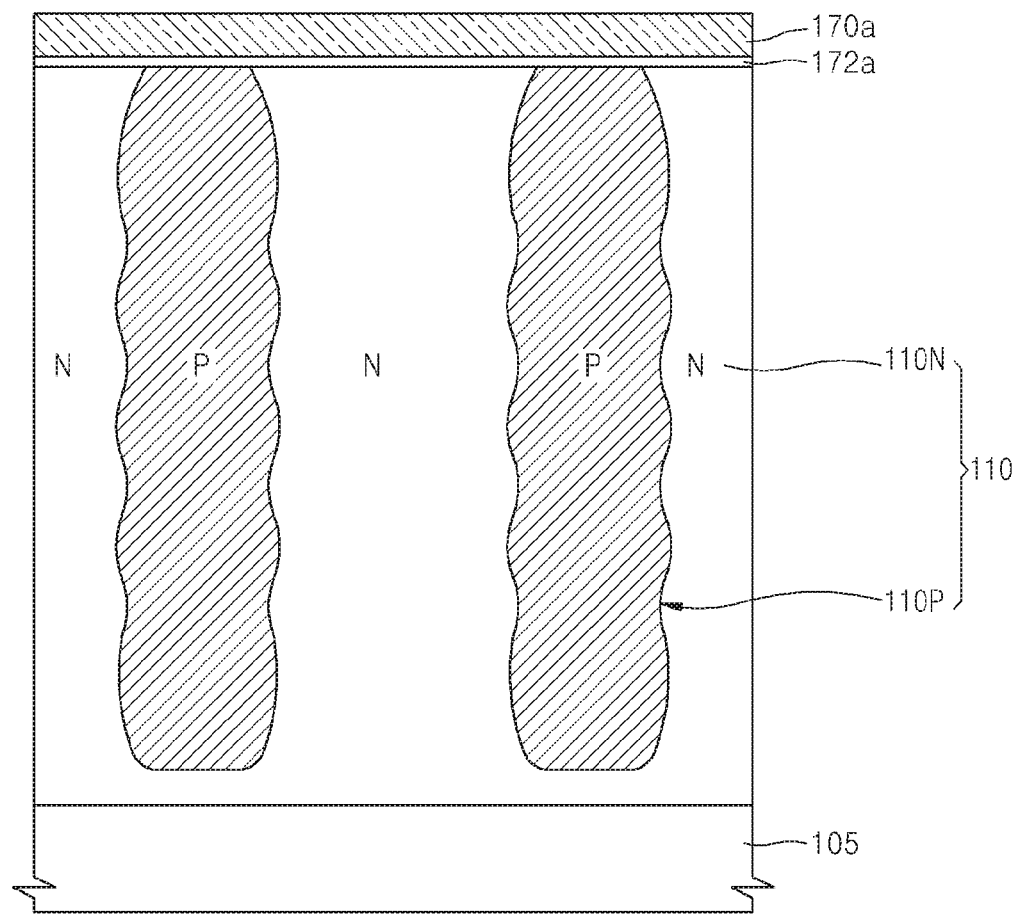
Figure 9N:
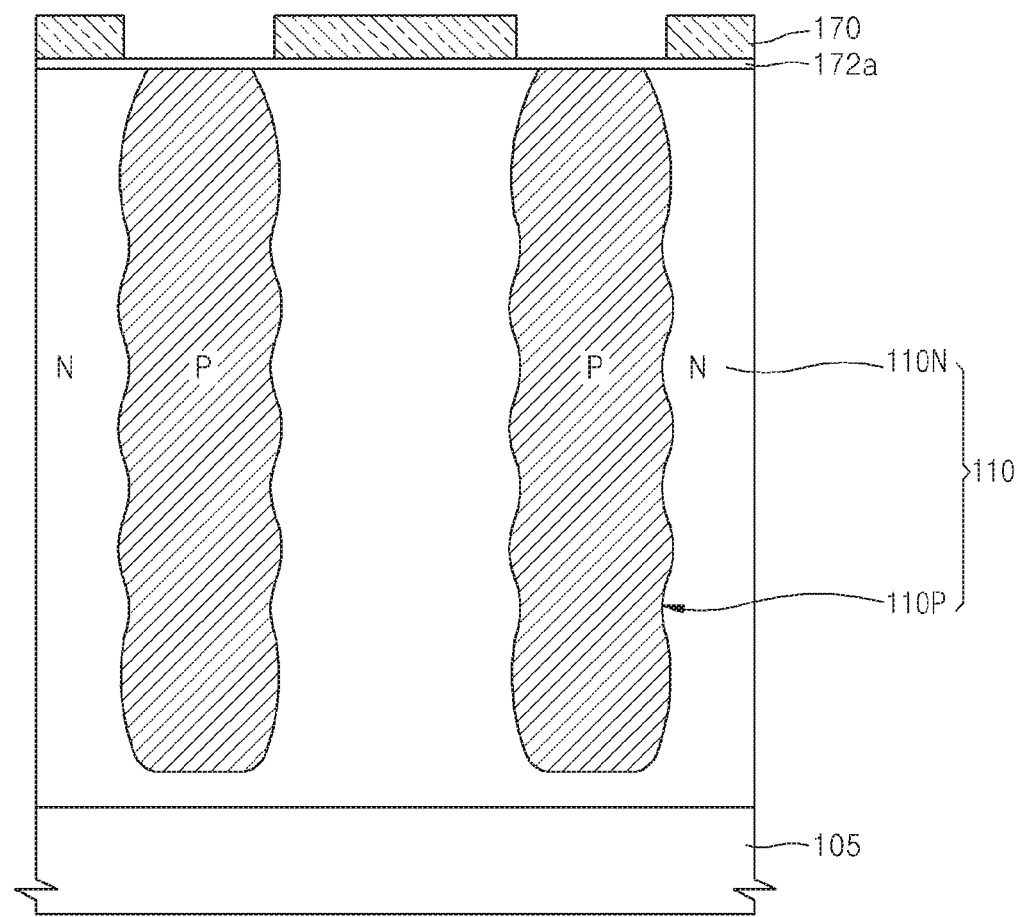
Figure 9O:
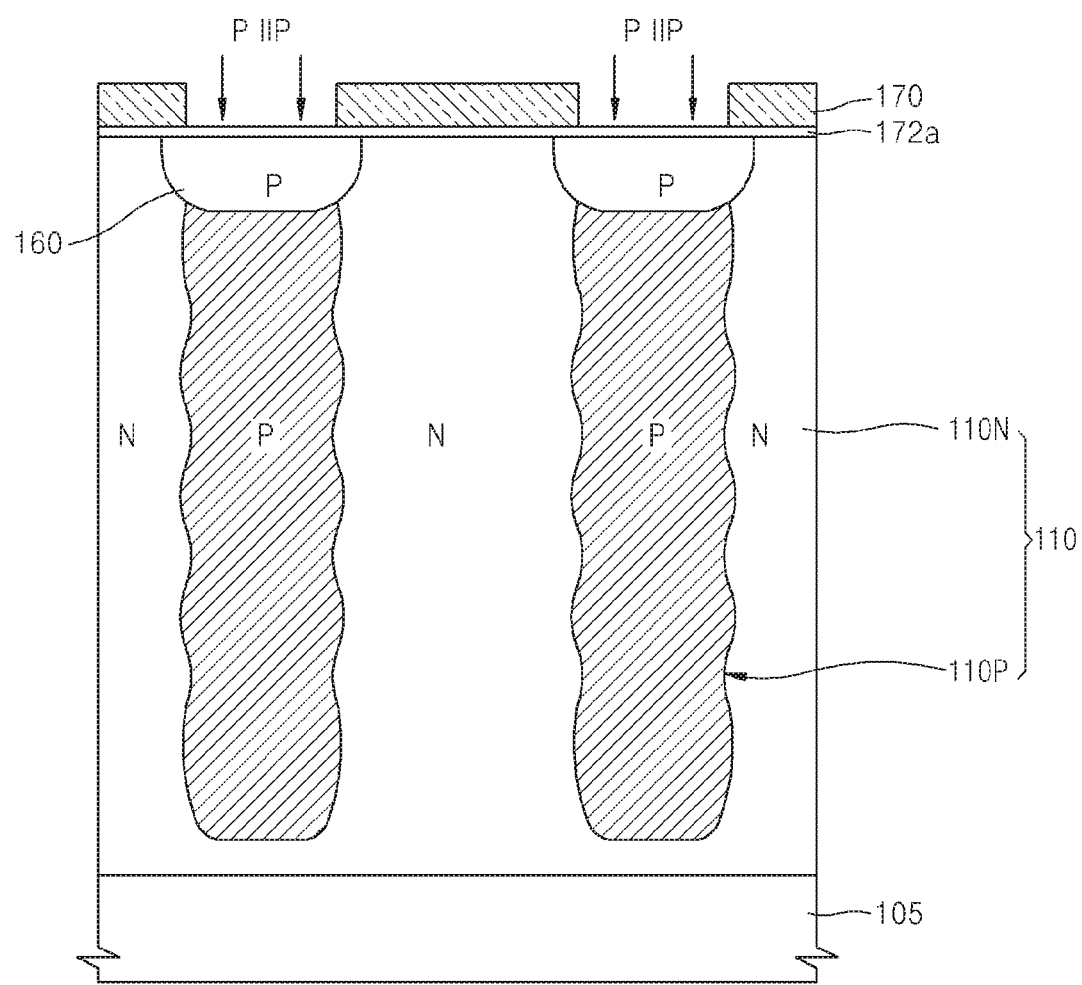
Figure 9P:
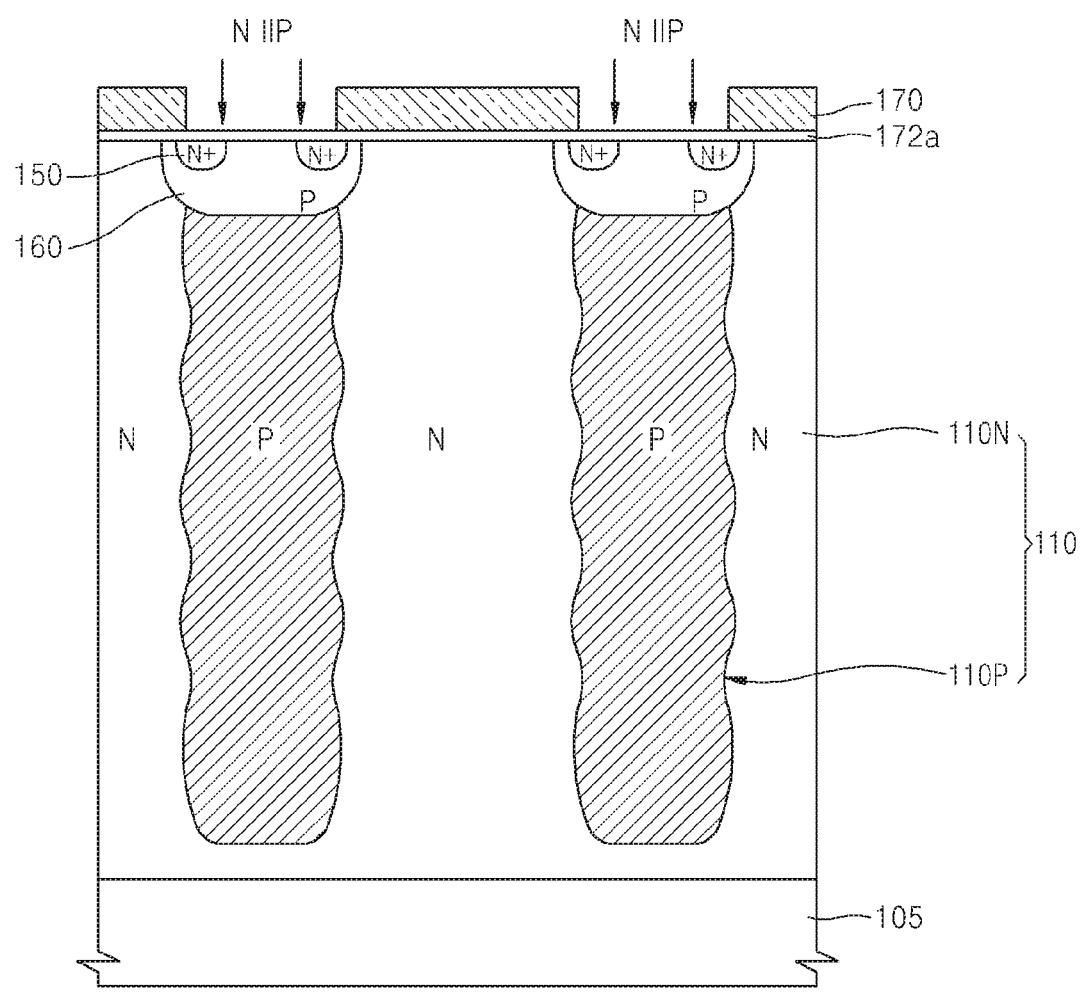
Figure 9Q:
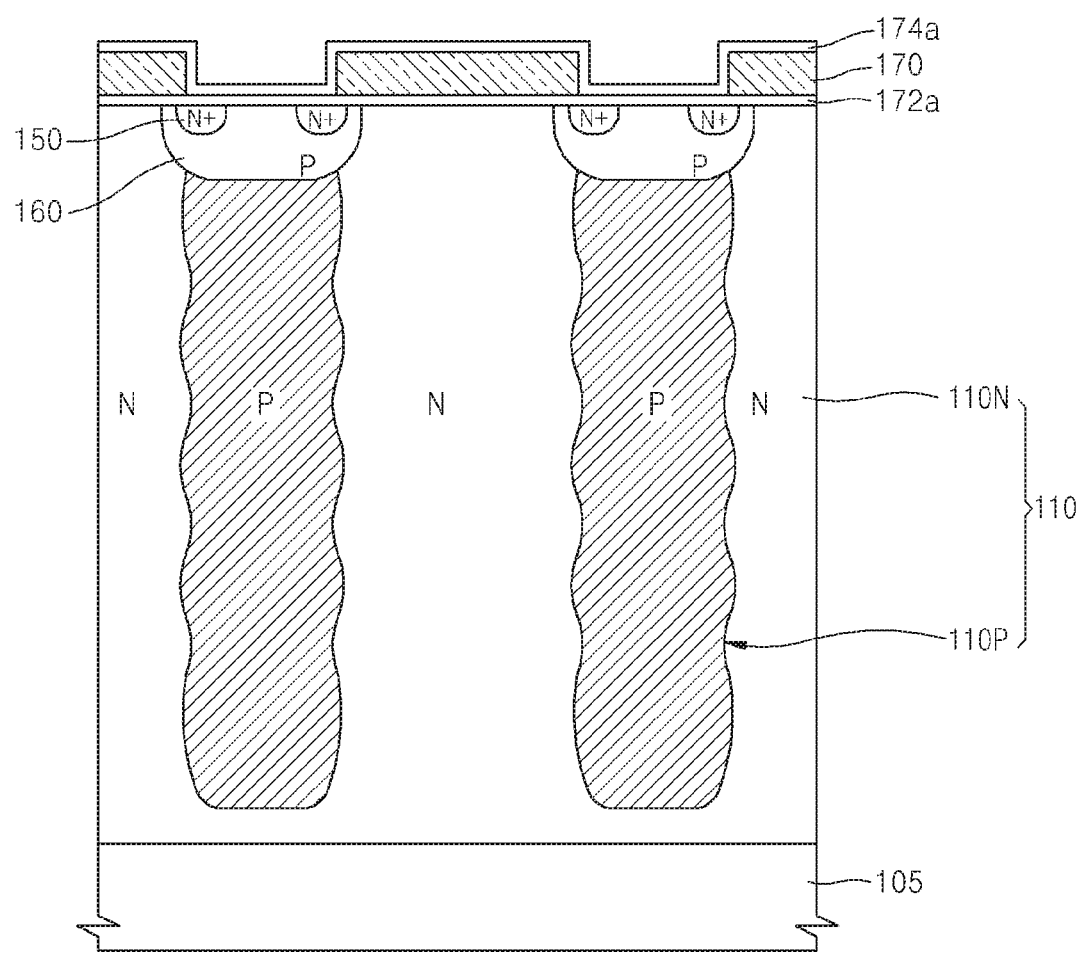
Figure 9R:
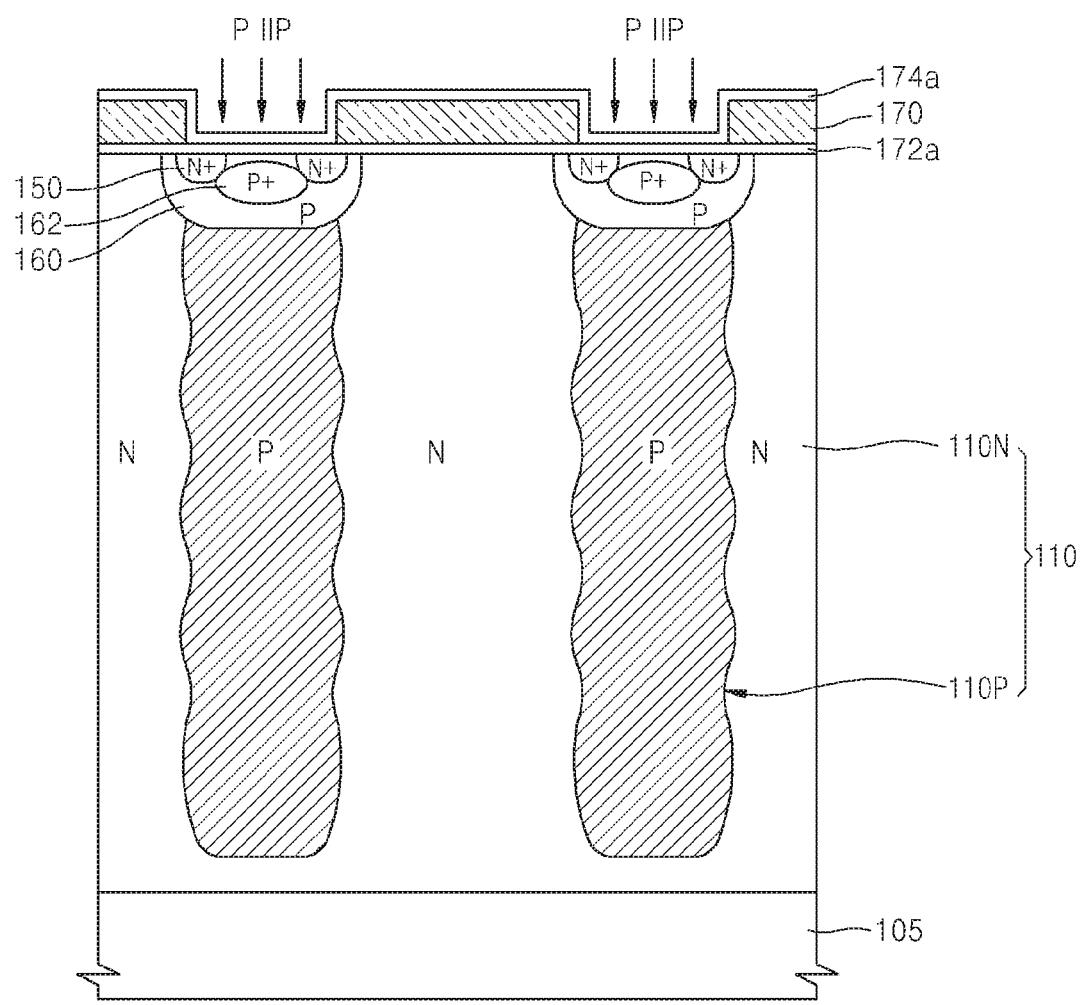
Figure 9S:
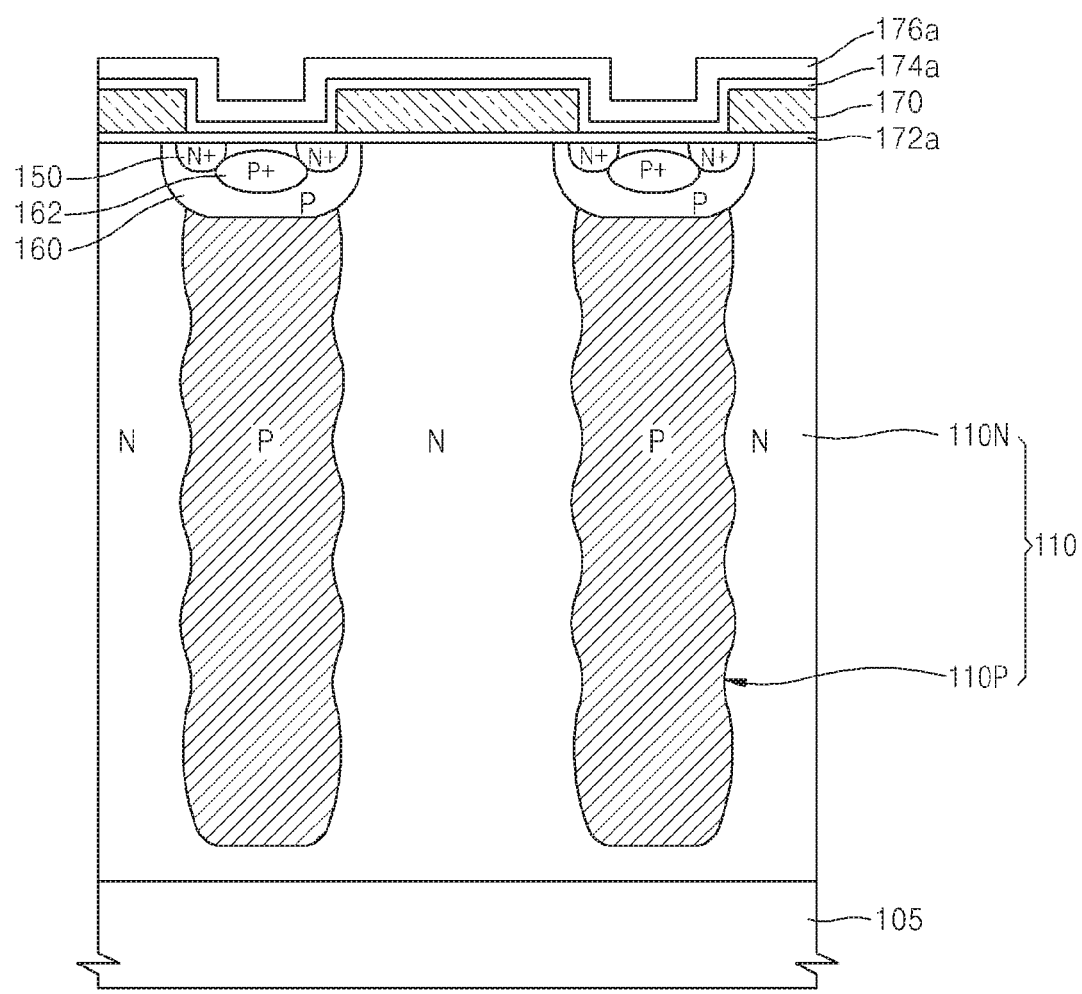
Figure 9T:
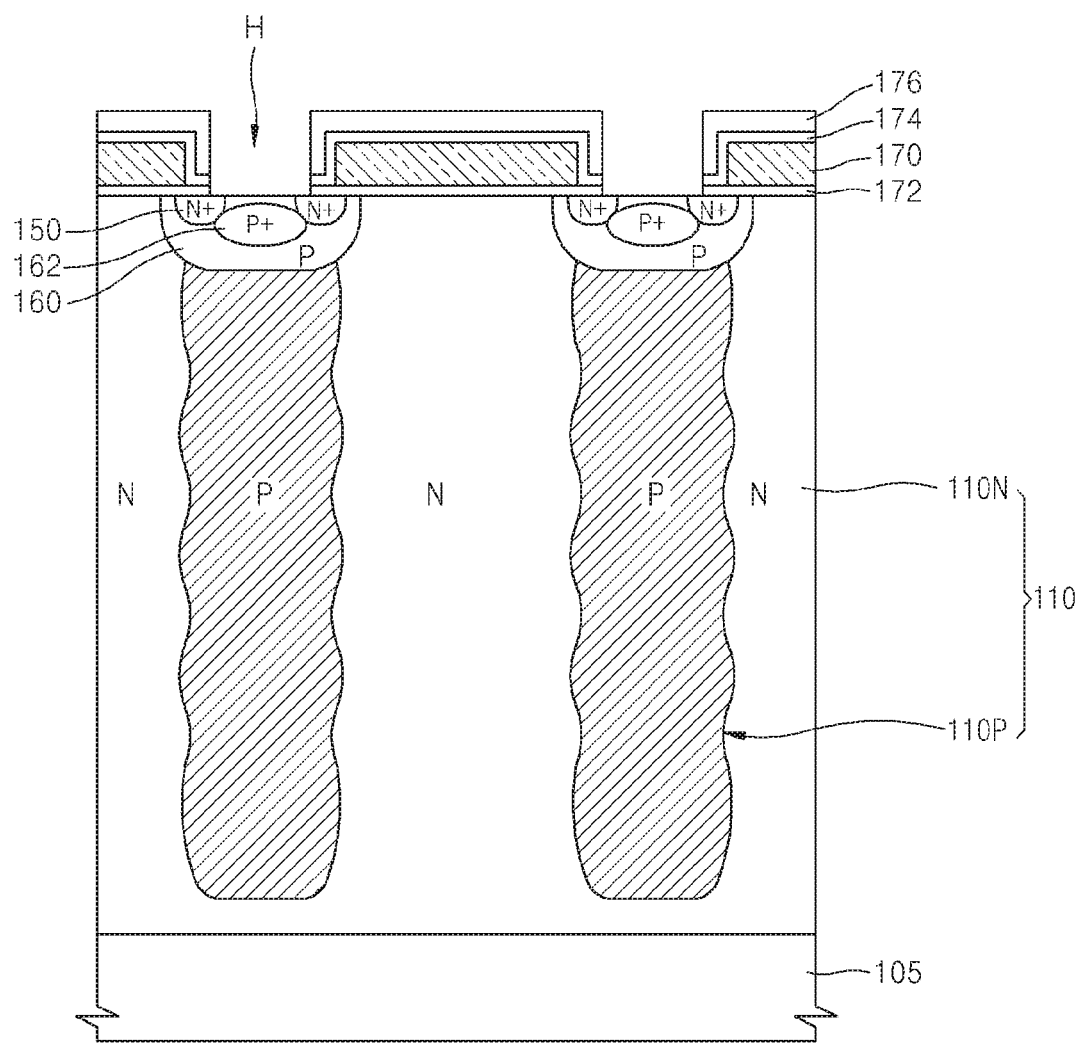
Figure 9U:
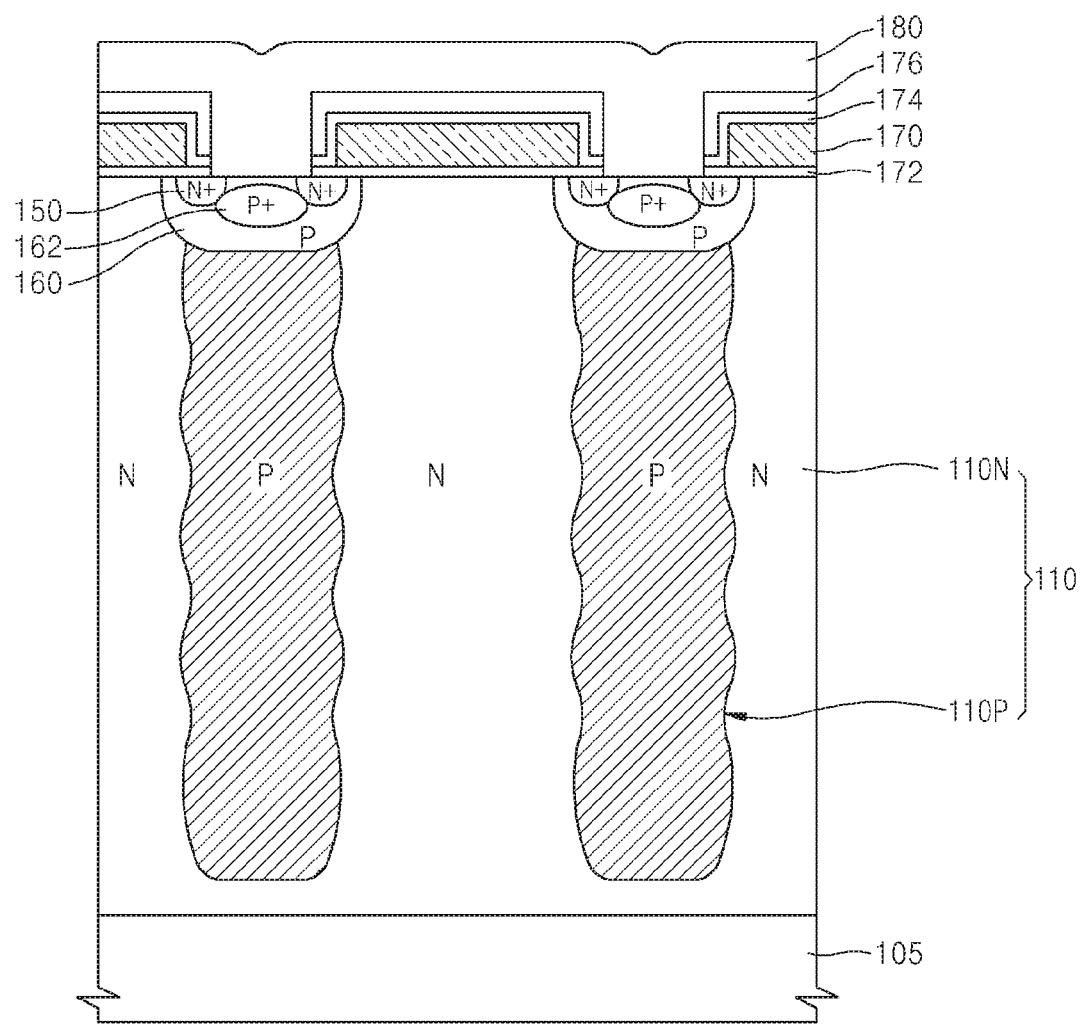

The N-type dopant profile in the vertical and horizontal directions may become clear with reference to FIGS. 9A through 9U describing a semiconductor device manufacturing process.

Figure 6:
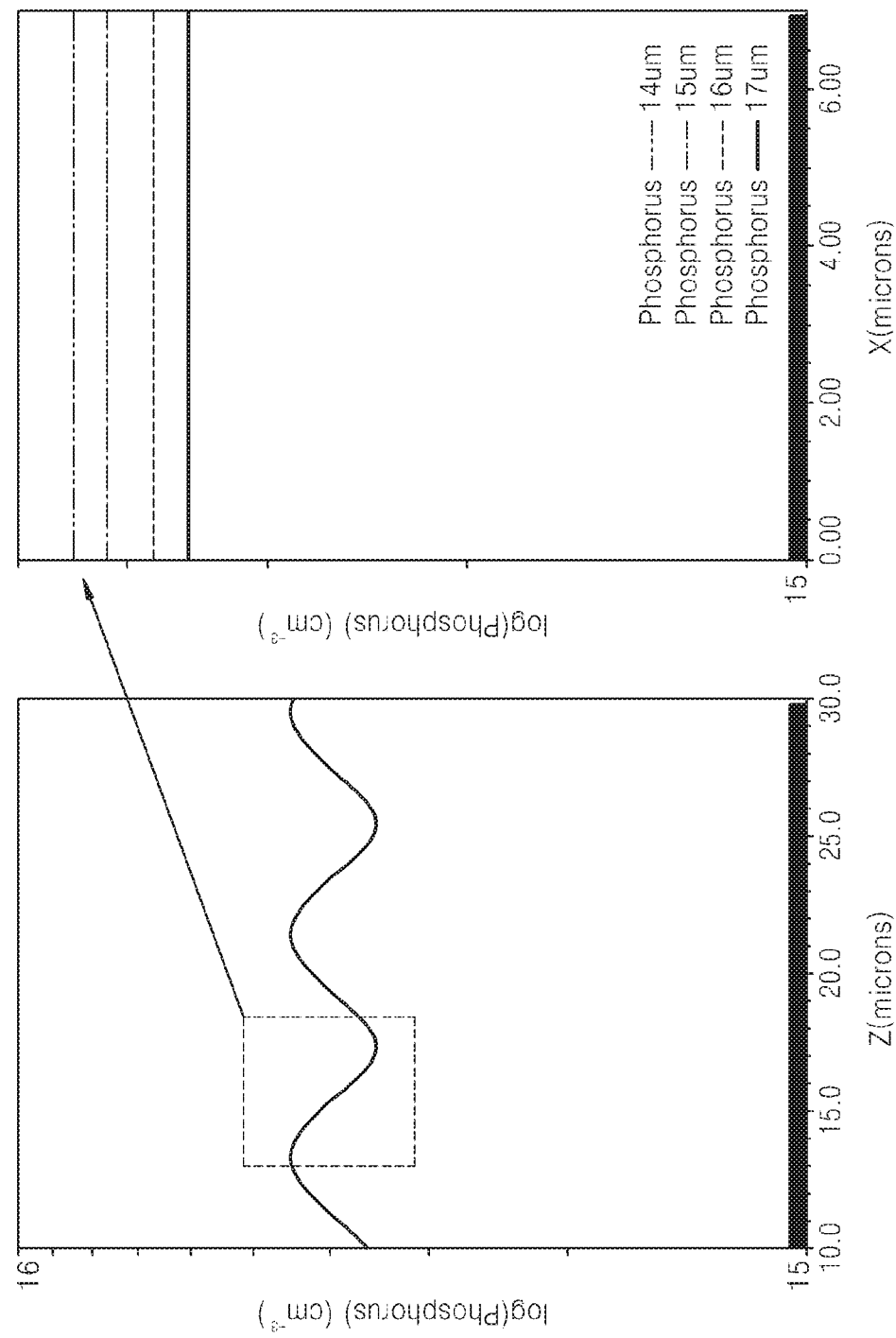
FIG. 6 illustrates a graph of an N-type dopant profile along a line II-II' of FIG. 3, and a graph of the N-type dopant profile in a horizontal direction with respect to heights in a dotted rectangle.

FIG. 6 illustrates a graph of an N-type dopant profile along a line II-II' of FIG. 3, and a graph of the N-type dopant profile in a horizontal direction with respect to heights in a dotted rectangle.

Referring to FIG. 6, the left-side graph with respect to the N-type dopant profile in a vertical direction is the same as the left-side graph of FIG. 5. In other words, according to heights, a high density part and a low density part may exist in the N-type dopant profile in the vertical direction. For example, according to the heights, the N-type dopant profile may sinusoidally vary in the vertical direction.

The right-side graph of FIG. 6 illustrates the N-type dopant profiles in the horizontal direction with respect to the heights in the dotted rectangle, wherein the heights are 14 μm, 15 μm, 16 μm, and 17 μm (in a Z-axis). As illustrated in FIG. 6, it is possible to see that, although densities of the N-type dopant are different according to the heights, the density of the N-type dopant in each height is constant in the horizontal direction.

Figure 7:
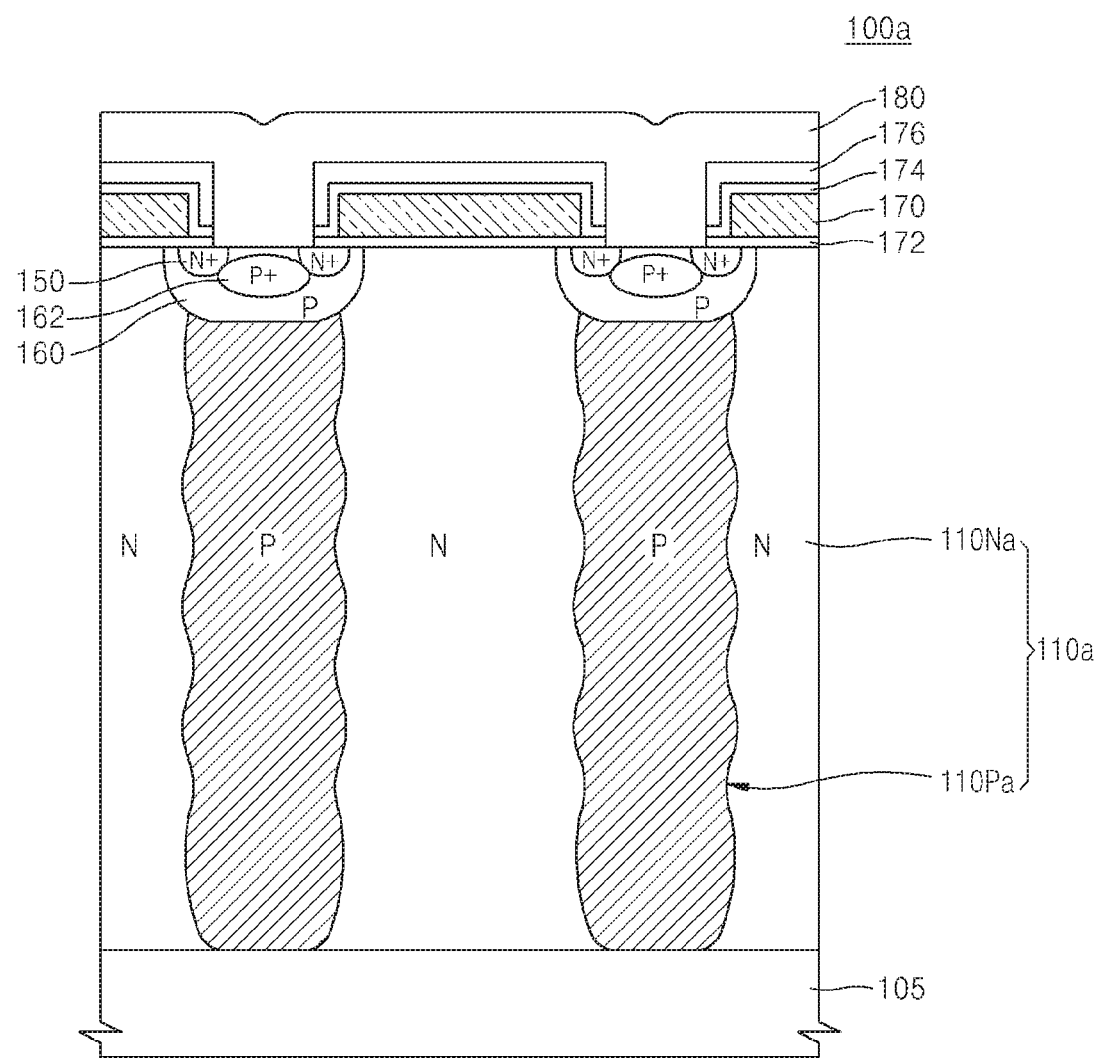
FIG. 7 is a cross-sectional view illustrating an active region taken along a line I-I' of FIG. 2A according to another embodiment of the inventive concept.

FIG. 7 is a cross-sectional view illustrating an active region taken along a line I-I' of FIG. 2A according to another embodiment of the inventive concept. For convenience of description, a structure of a semiconductor device 100a which is the same as the structure of the semiconductor device 100 of FIG. 3 is omitted or briefly described.

Referring to FIG. 7, P-type pillars 110Pa of a blocking layer 110a in the semiconductor device 100a may contact a semiconductor substrate 105. Because the P-type pillars 110Pa contact the semiconductor substrate 105, N-type pillars 110Na may be separated from each other by the P-type pillars 110Pa.

In this manner, the structure in which the P-type pillars 110Pa contact the semiconductor substrate 105 may be embodied by extending a diffusion time when the P-type pillars 110Pa and the N-type pillars 110Na are formed, or by lessening a thickness of an undoped epi-layer that is formed at a bottom.

Figure 8:
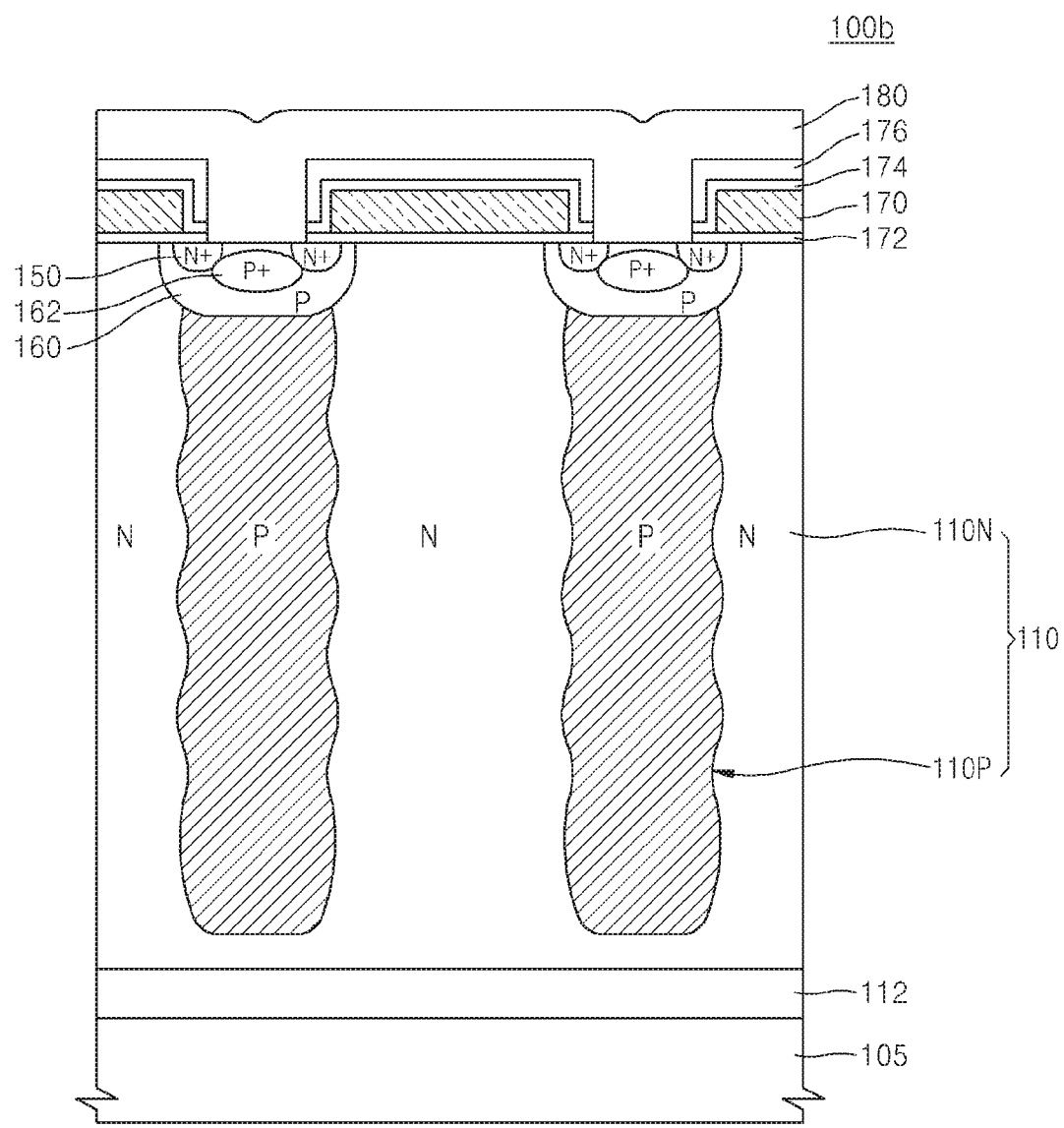
FIG. 8 is a cross-sectional view illustrating an active region taken along a line I-I' of FIG. 2A according to another embodiment of the inventive concept.

FIG. 8 is a cross-sectional view illustrating an active region taken along a line I-I' of FIG. 2A according to another embodiment of the inventive concept. For convenience of description, a structure of a semiconductor device 100b which is the same as the structure of the semiconductor device 100 of FIG. 3 is omitted or briefly described.

Referring to FIG. 8, the semiconductor device 100b may further include a buffer layer, that is, an N-type epi-layer 112 formed on a semiconductor substrate 105. The N-type epi-layer 112 may be formed by growing an N-type epi-layer on the semiconductor substrate 105 before an undoped epi-layer is formed at a bottom. N-type dopant density of the N-type epi-layer 112 may be equal to, greater, or less than an N-type pillar 110N.

Although not illustrated in FIG. 8, an upper N-type epi-layer may remain on an N-type pillar. In other words, the upper N-type epi-layer may be formed in a top portion when a P-type pillar and the N-type pillar are formed, and in this regard, after diffusion, a small amount of the upper N-type epi-layer may remain on the N-type pillar. Dopant density of the upper N-type epi-layer may be greater than the N-type pillar.

Also, a low density N-type implant layer (not shown) that is lightly doped with an N-type dopant may be formed on the N-type pillar. The low density N-type implant layer may have lower density than the N-type pillar.

FIGS. 9A through 9U are cross-sectional views illustrating a method of manufacturing the semiconductor device 100 of FIG. 3, according to an embodiment of the inventive concept.

Referring to FIG. 9A, a first undoped epi-layer 110-U1 having a first thickness D1 is formed on a semiconductor substrate 105. The semiconductor substrate 105 may be a high density N-type (N+) substrate. The first undoped epi-layer 110-U1 may be an intrinsic semiconductor layer that is not doped in-situ—with a dopant. The first undoped epi-layer 110-U1 may be formed using an epitaxial growth method. By adjusting the first thickness D1 of the first undoped epi-layer 110-U1, P-type pillars may be formed separate from each other at regular intervals on the semiconductor substrate 105 or to contact the semiconductor substrate 105, as in the semiconductor device 100 of FIG. 3 or in the semiconductor device 100a of FIG. 7.

Referring to FIG. 9B, an N-type dopant is whole surface-implanted in an upper region of the first undoped epi-layer 110-U1, so that a first N-type implant layer 110-N1 is formed. The whole surface-implanting operation indicates ion implantation into an entire region of the first undoped epi-layer 110-U1 without using a mask pattern. The first N-type implant layer 110-N1 is a source region for supplying an N-type dopant in a subsequent diffusion process. Here, the N-type dopant may be phosphorus (P) but is not limited thereto.

In this manner, the first N-type implant layer 110-N1 is formed via the whole surface-implanting operation, so that an N-type dopant profile in a horizontal direction of a blocking layer may be uniform. Although dopants of the first N-type implant layer 110-N1 are diffused to the first undoped epi-layer 110-U1 in the subsequent diffusion process, an amount of the dopants diffusing to the first undoped epi-layer 110-U1 is also uniform, so that the N-type dopant profile in the horizontal direction of the blocking layer is uniform.

Referring to FIG. 9C, a P-type dopant is implanted in predetermined portions of the first N-type implant layer 110-N1 so that a first P-type implant layer 110-P1 is formed. Unlike the first N-type implant layer 110-N1, the first P-type implant layer 110-P1 may be formed using a predetermined mask pattern. Because the first P-type implant layer 110-P1 is formed by changing the first N-type implant layer 110-N1 into a P-type implant layer, it is necessary to implant more P-type dopant per each unit area, compared to an amount of N-type dopant used to form the first N-type implant layer 110-N1. The P-type dopant may be boron (B) but is not limited thereto.

Referring to FIG. 9D, a second undoped epi-layer 110-U2 is formed on the first N-type implant layer 110-N1 and the first P-type implant layer 110-P1. The second undoped epi-layer 110-U2 may have a second thickness D2. The second thickness D2 may be equal to or less than the first thickness D1 of the first undoped epi-layer 110-U1. In a case where the P-type pillars are formed to contact the semiconductor substrate 105, as in FIG. 7, the first thickness D1 of the first undoped epi-layer 110-U1 may be less than the second thickness D2 of the second undoped epi-layer 110-U2.

Referring to FIGS. 9E and 9F, as in FIGS. 9B and 9C, a second N-type implant layer 110-N2 is formed on an upper region of the second undoped epi-layer 110-U2 by using the whole surface-implanting operation, and then the P-type dopant is implanted in predetermined portions of the second N-type implant layer 110-N2 so that a second P-type implant layer 110-P2 is formed.

Referring to FIG. 9G, by repeating processes of FIGS. 9D through 9F, third through sixth undoped epi-layers 110-U3 through 110-U6, third through fifth N-type implant layers 110-N3 through 110-N5, and third through fifth P-type implant layers 110-P3 through 110-P5 are formed.

A thickness of each of the third through fifth undoped epi-layers 110-U3 through 110-U5 may be equal to the second thickness D2 of the second undoped epi-layer 110-U2. However, the sixth undoped epi-layer 110-U6 that is an uppermost layer may have a third thickness D3. The third thickness D3 may be less than the second thickness D2 of the second undoped epi-layer 110-U2.

Referring to FIG. 9H, an upper N-type epi-layer 116 having a fourth thickness D4 is formed on the sixth undoped epi-layer 110-U6. The fourth thickness D4 may be equal to or less than the third thickness D3 of the sixth undoped epi-layer 110-U6.

In the present embodiment, although the first through sixth undoped epi-layers 110-U1 through 110-U6, the first through fifth N-type implant layers 110-N1 through 110-N5, and the first through fifth P-type implant layers 110-P1 through 110-P5 are formed, the number of layers is not limited to the ones formed. In other words, according to a structure of the semiconductor device, the number of undoped epi-layers, the number of N-type implant layers, and the number of P-type implant layers may vary. With respect to the first through sixth undoped epi-layers 110-U1 through 110-U6, the first through fifth N-type implant layers 110-N1 through 110-N5, and the first through fifth P-type implant layers 110-P1 through 110-P5, their thicknesses and an amount of dopants to be implanted may be accurately calculated for N-type pillars and P-type pillars, which are formed in the subsequent diffusion process, and a super junction structure thereof. In other words, a charge quantity of dopants, which are included in the super junction structure formed by the N-type and P-type pillars that are formed in the subsequent diffusion process, has to be controlled so as to satisfy the aforementioned Equation 1.

In order to form the N-type and P-type pillars according to the related art, a plurality of N-type epi-layers are formed and then a P-type implant layer is formed on a predetermined region of each N-type epi-layer. However, this conventional method has a problem in controlling a uniform thickness of each epi-layer and simultaneously controlling the density of an N-type dopant during a growth of each epi-layer, such that a defect rate increases. In other words, a 3-sigma value with respect to a resistance and thickness of a semiconductor device manufactured using a conventional N-type epi process is about 10%. In other words, the 3-sigma value of the conventional N-type epi process may be about 10%.

On the other hand, according to the present embodiment, when an undoped epi-layer forming and whole surface-implanting method are used, it is only necessary to control the amount of dopants to be implanted, that is, an amount of dose, a 3-sigma value with respect to the amount of dose in a general semiconductor process is equal to or less than 2%. Thus, the 3-sigma value with respect to a resistance of a semiconductor device manufactured according to the one or more embodiments may be about 2%.

A 3-sigma level indicates a percentage of a portion deviating from 3 in a normal distribution curve, and the recognition of an allowable defect rate may vary according to a target sigma level.

According to the related art, a P-type dopant is implanted once in each N-type epi-layer, so that this conventional method is referred to as a single implant method. On the other hand, according to the present embodiment, for an N-type implant layer, the whole surface-implanting operation using an N-type dopant is performed in each undoped epi-layer, and in order to distinguish between the single implant method and a method according to the present embodiment, the method according to the present embodiment is referred to as a whole surface-implanting method.

In more detail, charge quantity adjustment by the single implant method and charge quantity adjustment by the whole surface-implanting method are compared with respect to the undoped epi-layers.

When a thickness of each of the second through fifth undoped epi-layers 110-U2 through 110-U5 is 8 μm, and a pitch of each cell is 7 μm, if a total charge quantity $Q_{n,total}$ per unit area of one layer is 2.23E5, a charge quantity $Q_n$ for super junction is about 2.23E5/(8E-4*1E-4)=2.8E12 cm$^{-2}$. In general, the charge quantity $Q_n$ for super junction is about 1E12 cm$^{-2}$, and an allowable charge quantity reaches 2.51E12 cm$^{-2}$.

In order to implement $Q_n$=2.8E12 cm$^{-2}$, if the single implant method is used, N-type dopant density of an N-type epi-layer has to be about 2.23E5/(7E-4*1E-4*8E-4)=4E15 cm$^{-3}$. On the other hand, if the whole surface-implanting method is used, an N-type dopant dose is about 2.23E5/(7E-4*1E-4)=3.2E12 cm$^{-2}$. A P-type dopant implantation condition for both the single implant method and the whole surface-implanting method may vary between 1.34E13~1.62E13 cm$^{-2}$ according to each layer. For example, a P-type dopant dose to be implanted in a third undoped epi-layer may be about 1.48E13 cm$^{-2}$.

For convenience of description, the first through sixth undoped epi-layers 110-U1 through 110-U6 are collectively referred to as an undoped epi-layer 110-U, the first through fifth N-type implant layers 110-N1 through 110-N5 are collectively referred to as an N-type implant layer 110-N, and the first through fifth P-type implant layers 110-P1 through 110-P5 are collectively referred to as a P-type implant layer 110-P.

Referring to FIGS. 9I through 9K, when a thermal treatment is performed for a predetermined time period, N-type dopants of the N-type implant layer 110-N may diffuse to the undoped epi-layer 110-U so that an N-type diffusion region 114a may be formed. Also, P-type dopants of the P-type implant layer 110-P may diffuse to the undoped epi-layer 110-U so that a P-type diffusion region 118a may be formed. N-type dopants of the upper N-type epi-layer 116 may diffuse to the undoped epi-layer 110-U.

For convenience of understanding with respect to a diffusion process, FIGS. 9I through 9K illustrate the diffusion process divided into an initial stage, a middle stage, and a latter stage. In the initial stage of FIG. 9I, the P-type dopants of the P-type implant layer 110-P diffuse in an oval form, and the N-type dopants of the N-type implant layer 110-N diffuse in a vertical direction.

The reason for the aforementioned diffusion direction is that a horizontal width of the P-type implant layer 110-P is less than a horizontal width of the N-type implant layer 110-N, so that dopant density of the P-type implant layer 110-P is greater than dopant density of the N-type implant layer 110-N. When it is assumed that thicknesses of the P-type implant layer 110-P and the N-type implant layer 110-N are the same, it is obvious that the dopant density of the P-type implant layer 110-P having the relatively small width has to be high so as to satisfy the aforementioned Equation 1.

Due to a difference between the dopant densities, the P-type diffusion region 118a is slightly formed in a direction toward the N-type implant layer 110-N, and a side of the N-type diffusion region 114a is limited due to the P-type diffusion region 118a. Here, the limitation does not indicate that the N-type dopants do not diffuse but indicates that a boundary of an N-type diffusion region is defined by the P-type diffusion region 118a.

In the middle stage of FIG. 9J, a P-type diffusion region 118b and an N-type diffusion region 114b are formed while they diffuse in a vertical direction of the undoped epi-layer 110-U. A side of the N-type diffusion region 114b may be still limited by the P-type diffusion region 118b.

In the latter stage of FIG. 9K, the N-type diffusion regions 114b which have been diffusing in the vertical direction meet each other, so that integrated N-type pillars 110N are formed. Also, the P-type diffusion regions 118b meet each other, so that integrated P-type pillars 110P are formed. Accordingly, the N-type pillar 110N may be divided into the N-type implant layer 110-N (shown by using a dashed line) that is an N-type impurity ion supplying layer, and an N-type diffusion region 114 that is a pure diffusion region. Also, the P-type pillar 110P may be divided into the P-type implant layer 110-P (shown by using a dashed line) that is a P-type impurity ion supplying layer, and a P-type diffusion region 118 that is a pure diffusion region.

After the diffusion process, the upper N-type epi-layer 116 is included in the N-type pillar 110N. However, in another embodiment, a small portion of the upper N-type epi-layer 116 may remain on the N-type pillar 110N, and dopant density of the remaining upper N-type epi-layer (not shown) may be greater than the N-type pillar 110N.

The N-type pillar 110N may have a structure in which a horizontal width of a portion where the N-type implant layer 110-N existed may be minimal, and a horizontal width of a middle portion of an undoped epi-layer 110U may be maximal. Because a side surface of the N-type pillar 110N and a side surface of the P-type pillar 110P contact each other, a side surface curve of the P-type pillar 110P may be opposite to a side surface curve of the N-type pillar 110N. For example, the P-type pillar 110P may have a structure in which a horizontal width of a portion where the P-type implant layer 110-P existed may be maximal, and the horizontal width of the middle portion of the undoped epi-layer 110U may be minimal. However, in the present embodiment, the structures of the N-type pillar 110N and the P-type pillar 110P are not limited to the aforementioned structures and thus may vary according to the diffusion process, that is, the thermal treatment, a temperature, and the like. For example, by performing the thermal treatment for a long time period, the side surface curves of the N-type pillar 110N and the P-type pillar 110P may be nearly removed.

Referring back to the N-type dopant profile, in the initial stage, the N-type implant layer 110-N is formed by performing the N-type dopant whole surface-implanting operation on the undoped epi-layer 110-U, so that a profile of the N-type dopant in a horizontal direction is uniform. Also, after the diffusion process, an amount of dopant that diffuses is the same, so that the profile of the N-type dopant in the horizontal direction may be uniform. For example, a diffusion radius of the N-type dopant is nearly unlimited. On the other hand, a profile of the N-type dopant in a vertical direction is irregular. In other words, N-type dopant density of the portion where the N-type implant layer 110-N existed may be maximal, and N-type dopant density of a middle portion of the N-type diffusion region 114 may be minimal. In a case where the diffusion process is performed for a long time period, irregularity of the N-type dopant profile in the vertical direction may be significantly decreased.

Referring to FIGS. 9L through 9N, a gate oxide layer 172a is formed on the blocking layer 110. After the gate oxide layer 172a is formed, a poly silicon layer 170a for a gate electrode is formed on the gate oxide layer 172a. Afterward, the poly silicon layer 170a is patterned via a photolithography process, so that the gate electrode 170 is formed.

Referring to FIGS. 9O through 9R, the P-type dopant is implanted in upper regions of the P-type pillars 110P by using the gate electrode 170 as a mask, so that the P-type well 160, i.e., a body layer, is formed. Afterward, the N-type dopant is implanted in the P-type well 160, so that the source region 150 is formed. The source region 150 may be a high density N-type (N+) impurity region. One or more source regions 150 may be formed in the P-type well 160 by using a predetermined mask pattern. For example, two source regions 150 may be formed in each P-type well 160. Also, in another embodiment, the source region 150 having a ring shape may be formed in the P-type well 160.

Afterward, a nitride layer 174a is formed via deposition to cover the gate electrode 170 and the exposed gate oxide layer 172a. After the nitride layer 174a is formed, the P-type dopant is implanted in a portion below a gap between the two source regions 150 in the P-type well 160, so that the high density P-type impurity region 162 is formed. As described above, the high density P-type impurity region 162 is formed so as to improve the UIS characteristic.

Referring to FIGS. 9S through 9U, an insulating layer, i.e., a BPSG layer 176a is formed so as to cover the nitride layer 174a. The nitride layer 174a and the BPSG layer 176a may function to insulate the source electrode 180 from the gate electrode 170.

Afterward, by performing a photolithography process, a hole H is formed so as to expose a top surface of the P-type well 160 including the source region 150. Via the hole H, side surfaces of the gate oxide layer 172 and the nitride layer 174 may be exposed. Because the hole H is formed, a side thickness of the BPSG layer 176 may be decreased.

Afterward, a metal layer is completely formed on a resultant substrate in which the hole H is formed, so that the source electrode 180 is formed. The source electrode 180 may electrically contact the source region 150. Although not illustrated, a drain electrode may be formed below the semiconductor substrate 105.

Figure 10A:
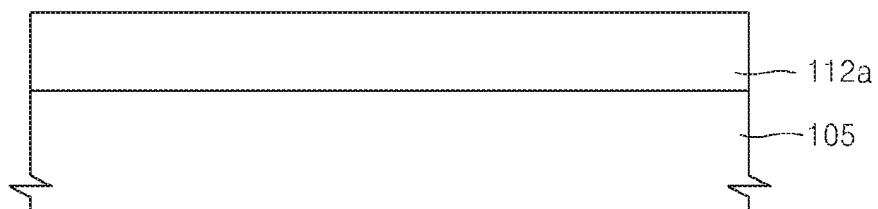
FIGS. 10A through 10C are cross-sectional views illustrating a method of manufacturing the semiconductor device of FIG. 8, according to another embodiment of the inventive concept.
Figure 10B:
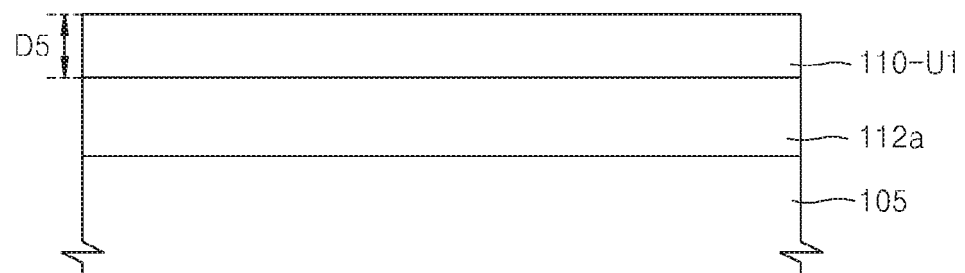
Figure 10C:
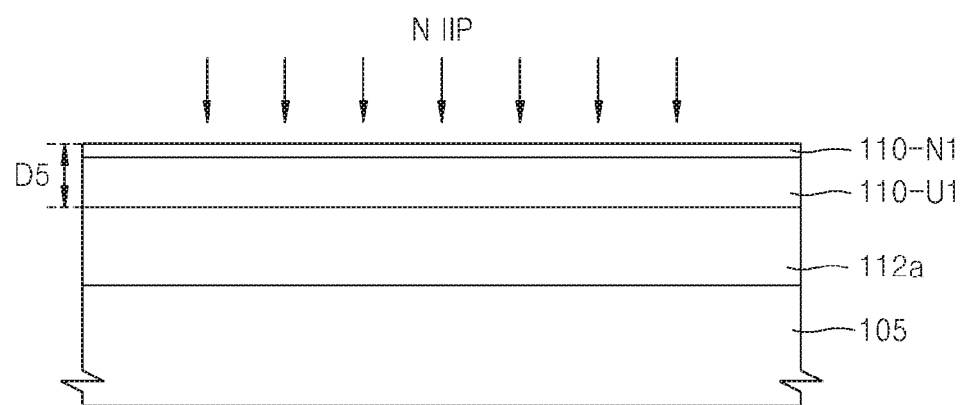

FIGS. 10A through 10C are cross-sectional views illustrating a method of manufacturing the semiconductor device 100b of FIG. 8, according to another embodiment of the inventive concept.

Referring to FIG. 10A, a lower N-type epi-layer 112a is formed on a semiconductor substrate 105. The semiconductor substrate 105 may be a high density N-type (N+) substrate.

The lower N-type epi-layer 112a is an N-type impurity semiconductor layer formed on the semiconductor substrate 105 by using an epitaxial growth method. After a diffusion process, the lower N-type epi-layer 112a may become the N-type epi-layer 112 as illustrated in FIG. 8. Accordingly, a thickness of the lower N-type epi-layer 112a may be determined in consideration of a thickness of the N-type epi-layer 112 to be formed.

Referring to FIG. 10B, a first undoped epi-layer 110-U1 is formed on the lower N-type epi-layer 112a. The first undoped epi-layer 110-U1 may be formed using the epitaxial growth method, and may be an intrinsic semiconductor layer that is not doped in-situ with a dopant. Due to the existence of the lower N-type epi-layer 112a, a fifth thickness D5 of the first undoped epi-layer 110-U1 may be less than the first thickness D1 of the first undoped epi-layer 110-U1 as illustrated in FIG. 9A.

Referring to FIG. 10C, an N-type dopant is whole surface-implanted in an upper region of the first undoped epi-layer 110-U1, so that a first N-type implant layer 110-N1 is formed. Processes thereafter are the same as those described with reference to FIGS. 9C through 9U, and a resultant semiconductor device may have a structure of the semiconductor device 100b of FIG. 8.

FIGS. 11 through 14 are cross-sectional views illustrating various examples of an epi-layer structure of FIG. 9H, according to embodiments of the inventive concept.

Figure 11:
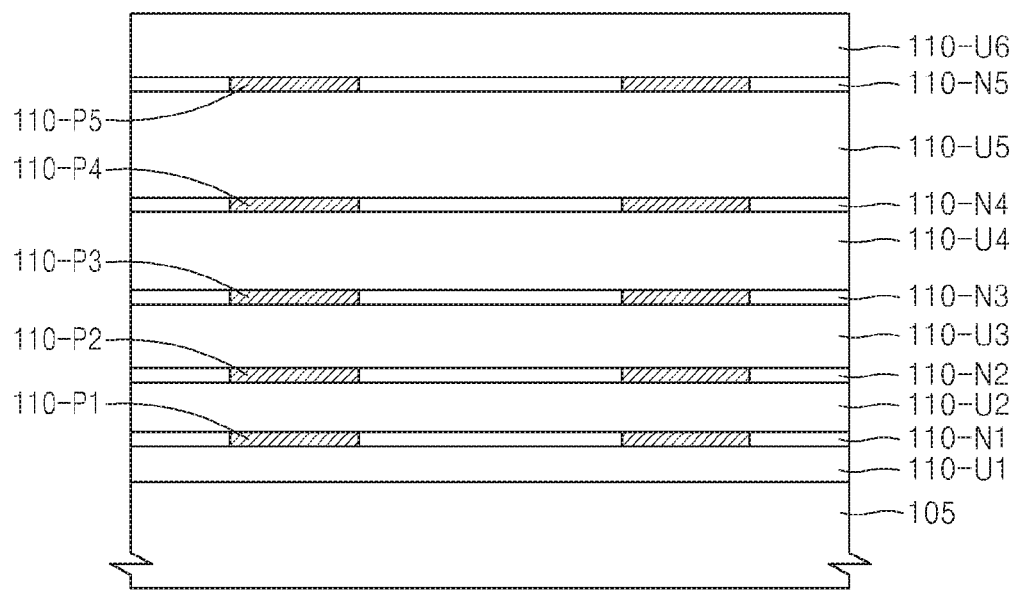
FIGS. 11 through 14 are cross-sectional views illustrating various examples of an epi-layer structure of FIG. 9H, according to embodiments of the inventive concept.

Referring to FIG. 11, an epi-layer structure according to the present embodiment is similar to the epi-layer structure of FIG. 9H but may be different in the thicknesses of undoped epi-layers, and an upper N-type epi-layer. In other words, the first through fifth undoped epi-layers 110-U1 through 110-U5 may be sequentially and heavily formed on the semiconductor substrate 105. Also, the sixth undoped epi-layer 110-U6 is formed on the fifth undoped epi-layer 110-U5, and the upper N-type epi-layer may not be formed on the sixth undoped epi-layer 110-U6.

Figure 12:
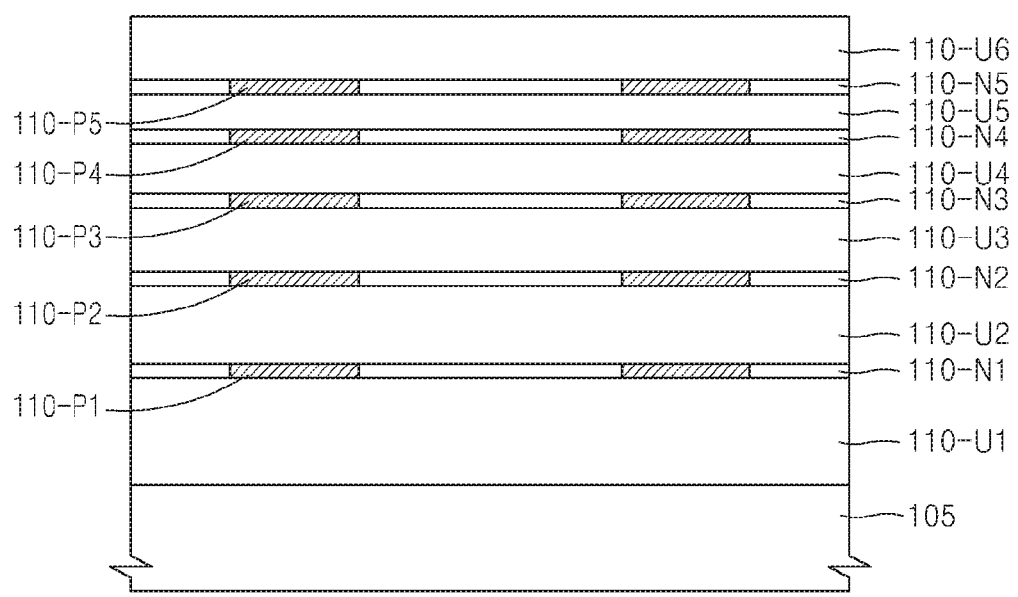

Referring to FIG. 12, unlike the epi-layer structure of FIG. 11, in an epi-layer structure according to the present embodiment, the first through fifth undoped epi-layers 110-U1 through 110-U5 may be sequentially and lightly formed on the semiconductor substrate 105. Except for this difference, other features may be the same as the epi-layer structure of FIG. 11.

Figure 13:
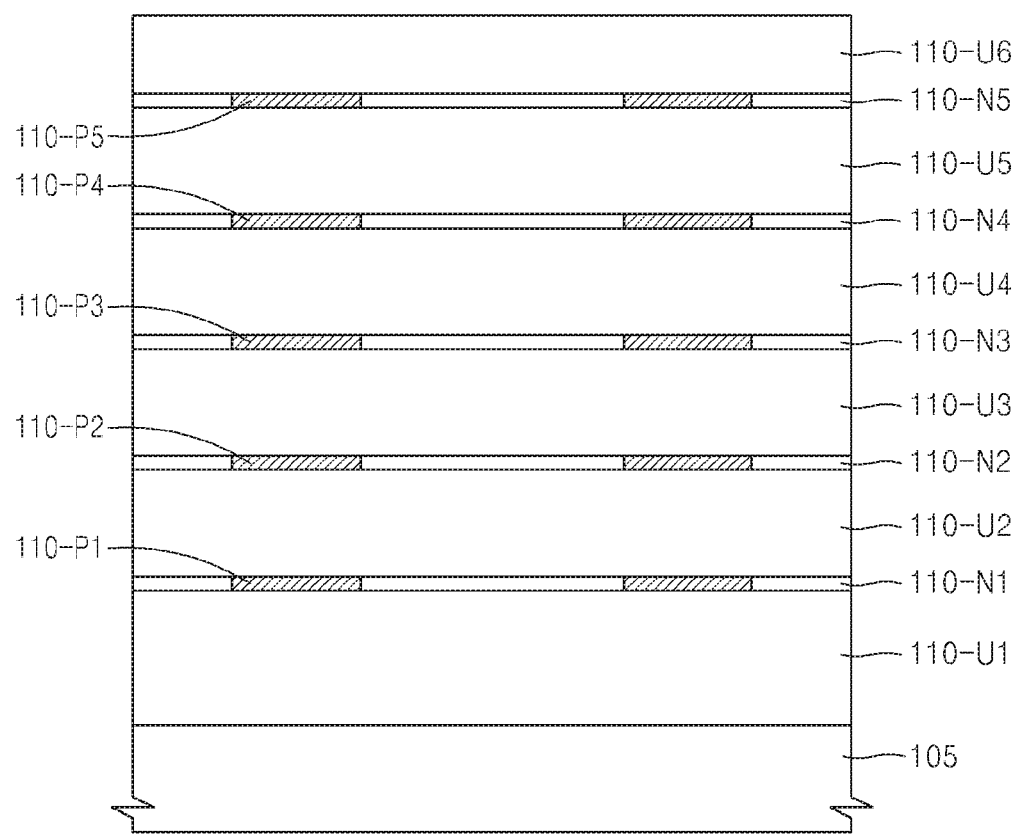

Referring to FIG. 13, an epi-layer structure according to the present embodiment is similar to the epi-layer structure of FIG. 9H but may be different in a sixth undoped epi-layer and an upper N-type epi-layer. In other words, according to the present embodiment, a thickness of the sixth undoped epi-layer 110-U6 may be greater than a thickness of the sixth undoped epi-layer 110-U6 of FIG. 9H, and the upper N-type epi-layer may not be formed on the sixth undoped epi-layer 110-U6.

Figure 14:
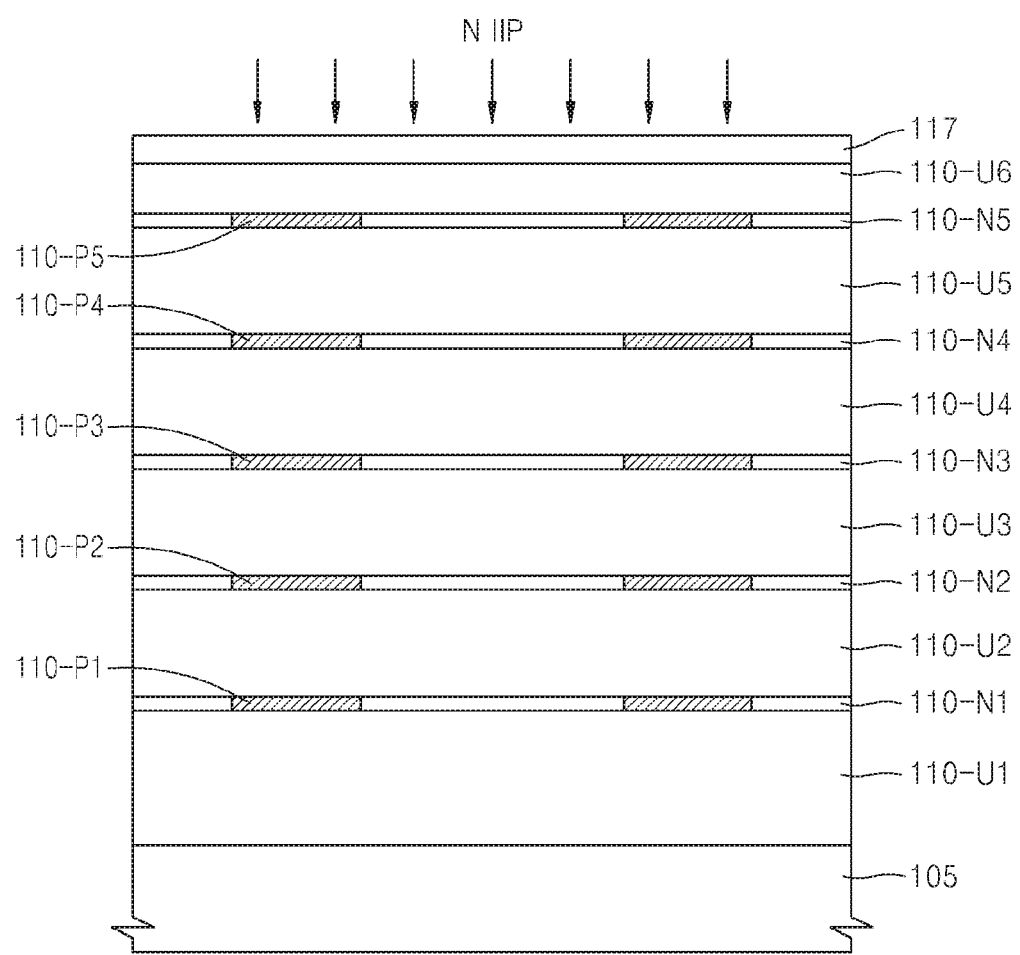

Referring to FIG. 14, an epi-layer structure according to the present embodiment is similar to the epi-layer structure of FIG. 9H but may be different in a forming method. In other words, a sixth undoped epi-layer 110-U6 may be heavily formed, and an N-type implant layer 117 may be formed in the sixth undoped epi-layer 110-U6. In more detail, the sixth undoped epi-layer 110-U6 of FIG. 14 may be heavily formed, compared to the sixth undoped epi-layer 110-U6 of FIG. 9H, and then an N-type dopant is implanted in an upper region of the sixth undoped epi-layer 110-U6 of FIG. 14 so that the N-type implant layer 117 may be formed. The N-type implant layer 117 may correspond to the upper N-type epi-layer 116 of FIG. 9H. The N-type implant layer 117 may be a low density N-type implant layer lightly implanted with the N-type dopant.

In the embodiments of FIGS. 11 through 14, the thicknesses of epi-layers in the epi-layer structures may be from about 2 to about 20 µm but are not limited thereto.

Figure 15A:
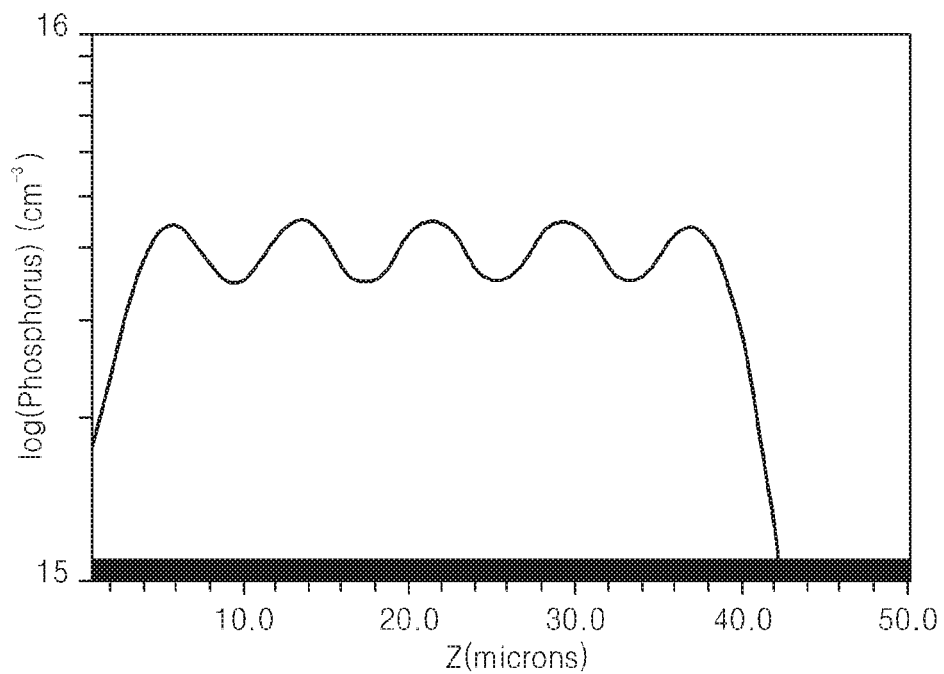
FIGS. 15A through 15C are graphs illustrating N-type dopant profiles in a vertical direction according to thicknesses of undoped epi-layers.
Figure 15B:
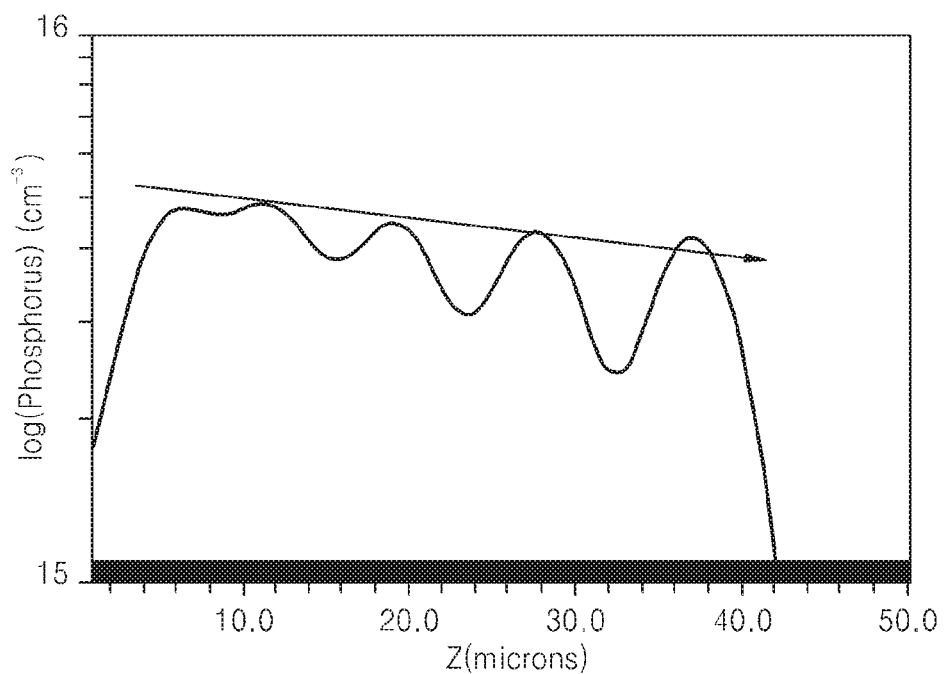
Figure 15C:
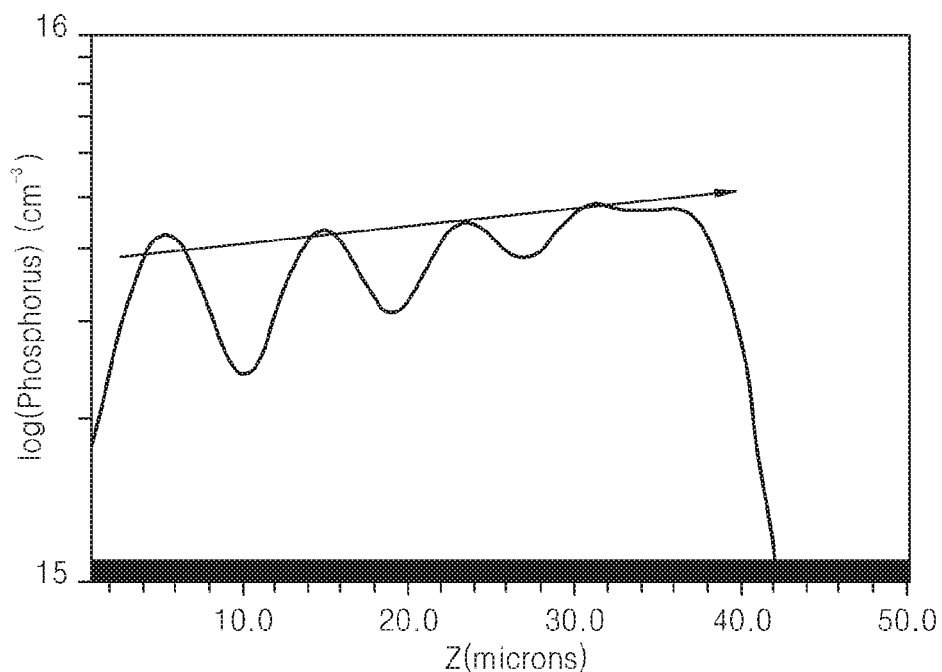

FIGS. 15A through 15C are graphs illustrating N-type dopant profiles in a vertical direction according to thicknesses of undoped epi-layers. Here, an amount of an N-type dopant dose implanted in each of the undoped epi-layers may be uniform.

Referring to FIGS. 15A through 15C, FIG. 15A is the graph of the N-type dopant profile in the vertical direction which corresponds to a case where the thicknesses of the undoped epi-layers are the same. Referring to FIG. 15A, it is possible to see that the N-type dopant profile sinusoidally varies in the vertical direction, similar to the left-side graph of FIG. 5. Both end portion of the graph of FIG. 15A respectively indicate a portion of the undoped epi-layer which is close to a substrate, and a portion of the undoped epi-layer which is close to an upper gate electrode.

FIG. 15B is the graph of the N-type dopant profile in the vertical direction which corresponds to a case where the undoped epi-layers are sequentially and lightly formed on a semiconductor substrate. Referring to FIG. 15B, it is possible to see that variation of N-type dopant density increases in a lower region, that is, the N-type dopant density significantly varies in a region where the undoped epi-layers are heavily formed. This is because an N-type pillar is formed via diffusion of the N-type dopant by using a thermal treatment. In FIG. 15B, a left side of the graph indicates a top surface side of a blocking layer, and a right side of the graph indicates a bottom side of the blocking layer, that is, a side close to the semiconductor substrate.

If the thicknesses of the undoped epi-layers are small, the N-type dopant may uniformly diffuse in all regions of the undoped epi-layers so that the variation of the N-type dopant density may be small. However, when the thicknesses of the undoped epi-layers are great, it is difficult for the N-type dopant to uniformly diffuse in all regions of the undoped epi-layers so that the N-type dopant density may significantly vary according to heights of the undoped epi-layers that are heavily formed.

As shown by using an arrow, the highest N-type dopant density of each of the undoped epi-layers may decrease as the thicknesses of the undoped epi-layers increase. This may be because the diffusion of the N-type dopant is further active in the region where the undoped epi-layers are heavily formed.

FIG. 15C is the graph of the N-type dopant profile in the vertical direction which corresponds to a case where the undoped epi-layers are sequentially and heavily formed on a semiconductor substrate, and the graph of FIG. 15C is opposite to the graph of FIG. 15B. In other words, it is possible to see that variation of N-type dopant density decreases in a lower region, that is, the N-type dopant density slightly varies in a region where the undoped epi-layers are lightly formed. Also, the highest N-type dopant density of each of the undoped epi-layers may increase as the thicknesses of the undoped epi-layers decrease.

Figure 16A:
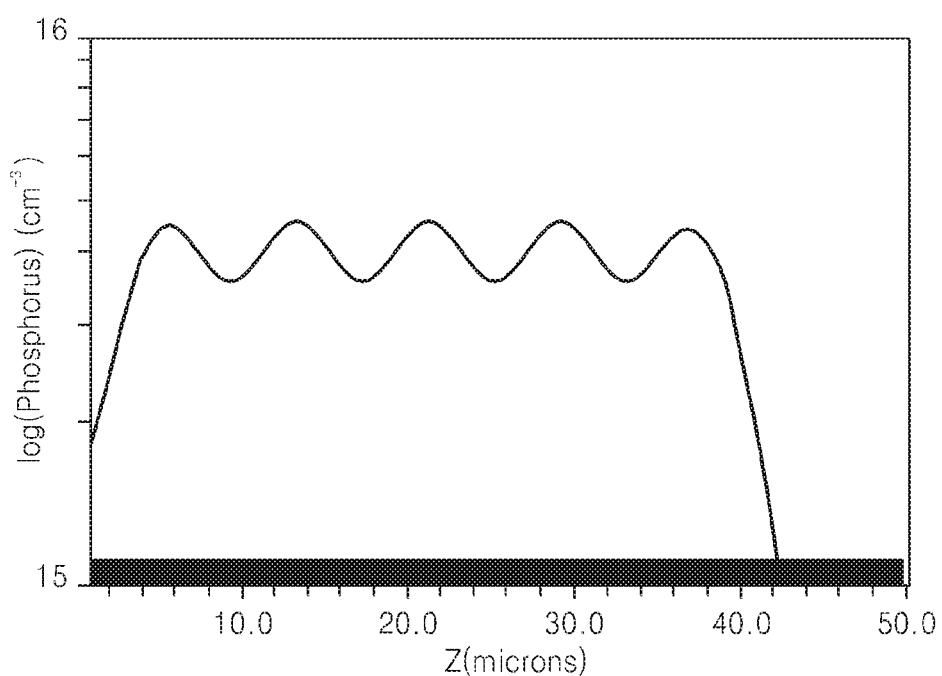
FIGS. 16A through 16C are graphs illustrating N-type dopant profiles in a vertical direction according to an amount of an N-type dopant dose implanted in each undoped epi-layer.
Figure 16B:
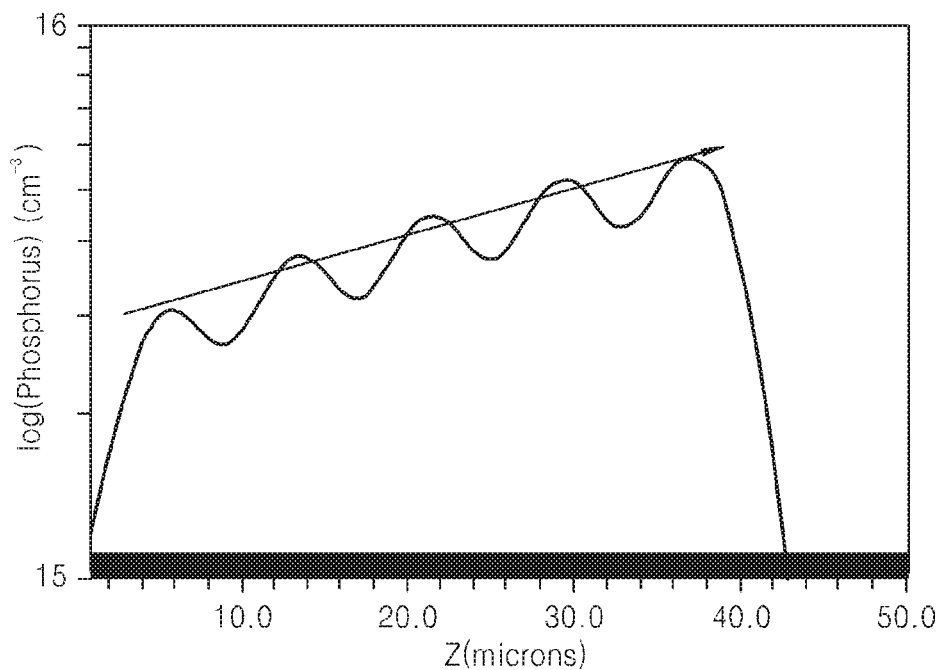
Figure 16C:
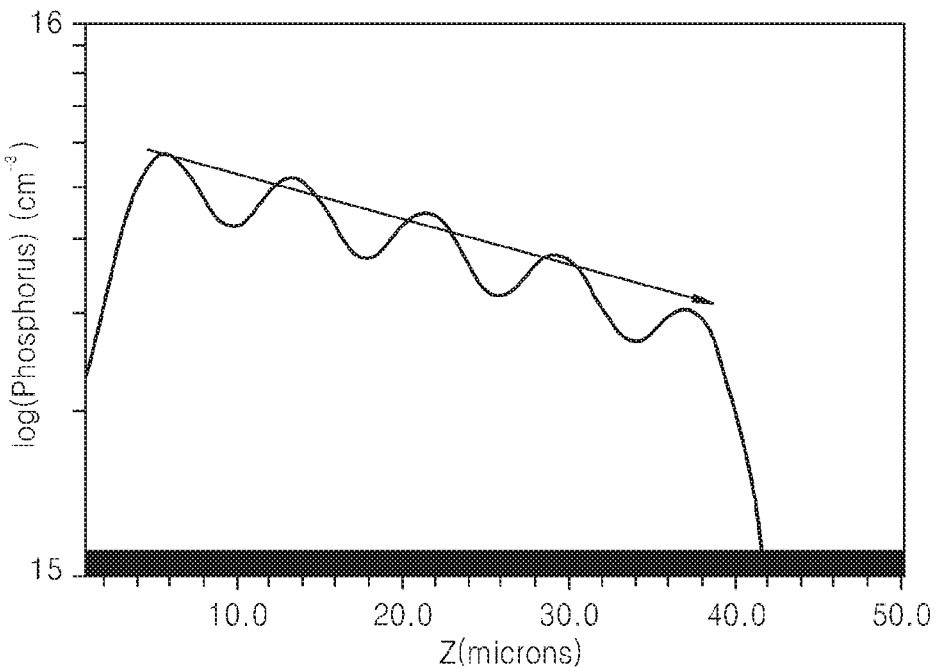

FIGS. 16A through 16C are graphs illustrating N-type dopant profiles in a vertical direction according to an amount of an N-type dopant dose implanted in each undoped epi-layer. Here, the thicknesses of the undoped epi-layers may be uniform.

Referring to FIGS. 16A through 16C, FIG. 16A is the graph of the N-type dopant profile in the vertical direction which corresponds to a case where the amount of the N-type dopant dose implanted in each of the undoped epi-layers is uniform, and FIG. 16A has the same shape as the graph of FIG. 15A.

FIG. 16B is the graph of the N-type dopant profile in the vertical direction which corresponds to a case where the amount of the N-type dopant dose implanted in each of the undoped epi-layers increases in lower layers. As shown by using an arrow, the highest N-type dopant density of each of the undoped epi-layers increases in the lower layers. In addition, the N-type dopant density similarly varies in each of the undoped epi-layers. In FIG. 16B, a left side of the graph indicates a top surface side of a blocking layer, and a right side of the graph indicates a bottom side of the blocking layer, that is, a side close to the semiconductor substrate.

FIG. 16C is the graph of the N-type dopant profile in the vertical direction which corresponds to a case where the amount of the N-type dopant dose implanted in each of the undoped epi-layers decreases in lower layers. As shown by using an arrow, the highest N-type dopant density of each of the undoped epi-layers decreases in the lower layers. In addition, the N-type dopant density similarly varies in each of the undoped epi-layers.

Regarding the graphs of FIGS. 16A through 16C, the amount of the N-type dopant dose implanted in each of the undoped epi-layers may be from about 1E11 $cm^{-2}$ to about E13 $cm^2$ but are not limited thereto.

FIGS. 11 through 16C are provided so as to describe that the epi-layer structure may vary and the amount of the N-type dopant dose of implant layers formed in the undoped epi-layers may vary, provided that the aforementioned Equation 1 is satisfied. Thus, regardless of the epi-layer structure or the amount of the N-type dopant dose, all methods including the whole surface-implanting method performed on the undoped epi-layer, or all semiconductor devices formed using one of the methods may be included in the present inventive concept.

Figure 17:
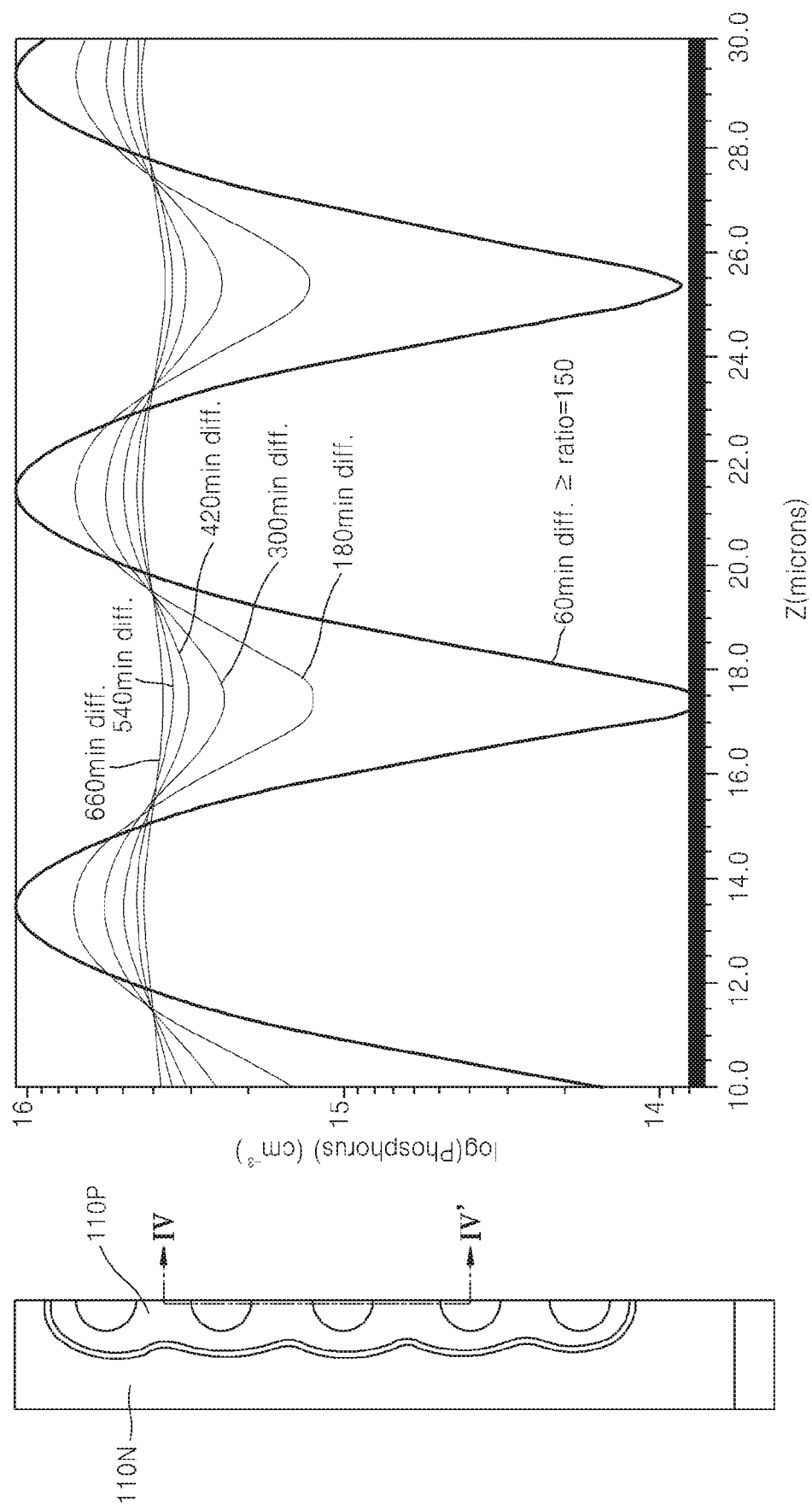
FIG. 17 illustrates a diagram and a graph showing an N-type dopant profile in a vertical direction according to thermal treatment time.

FIG. 17 illustrates a diagram and a graph showing an N-type dopant profile in a vertical direction according to thermal treatment time.

The left diagram illustrates a portion of a P-type pillar 110P in a blocking layer, and the right graph illustrates the N-type dopant profile along a cross-section of the P-type pillar 110P according to thermal treatment time, wherein the cross-section is taken along a line IV-IV' of FIG. 17. Here, an N-type dopant profile along a vertical cross-section of a portion of an N-type pillar 110N may be the same as the N-type dopant profile of the P-type pillar 110P.

The reason why the graph of FIG. 17 illustrates the N-type dopant profile of the portion of the P-type pillar 110P is that P-type implant layers (semicircles in a center portion) and P-type diffusion layers (outer portions of the semicircles) may be easily distinguished in the P-type pillar 110P. Accordingly, positions of N-type implant layers may correspond to positions of the P-type implant layers, and positions of N-type diffusion layers may correspond to positions of the P-type diffusion layers.

Referring to FIG. 17, the right graph illustrates the N-type dopant profile in the vertical direction according to thermal treatment time, that is, a diffusion time of 60 min, 180 min, 300 min, 420 min, 540 min, and 660 min. Regarding the diffusion time of 60 min, it is possible to see that the N-type dopant profile in the vertical direction significantly varies, e.g., a value of maximum density ($N_{peak}$)/minimum density ($N_{valley}$) is equal to or greater than 150. Also, a breakdown voltage (BV) at the diffusion time of 60 min is about 450V that may not be appropriate for a high voltage semiconductor device.

In a case of the diffusion time equal to or greater than 420 min, it is possible to see that variation of the N-type dopant profile in the vertical direction significantly decreases. In a case of the diffusion time equal to or greater than 180 min, the value of maximum density ($N_{peak}$)/minimum density ($N_{valley}$) is equal to or less than 100, and the BV is equal to or greater than 600 V that may be used in the high voltage semiconductor device. In other words, for a use in the high voltage semiconductor device requiring a BV that is equal to or greater than 600 V, the value of maximum density ($N_{peak}$)/minimum density ($N_{valley}$) has to be, equal to or less than 100.

In this regard, although the value of maximum density ($N_{peak}$)/minimum density ($N_{valley}$) may decrease as the diffusion time increases, a mass-production efficiency deteriorates accordingly, and additional contamination problems may be incurred. Thus, it is necessary to determine an appropriate diffusion time, in consideration of the mass-production efficiency and the contamination problems.

Above, the one or more embodiments are described with respect to an N-type metal-oxide-semiconductor field-effect transistor (MOSFET) device. However, by reversing a conduction type of each layer described above, a P-type MOSFET device may also be embodied.

Figure 18:
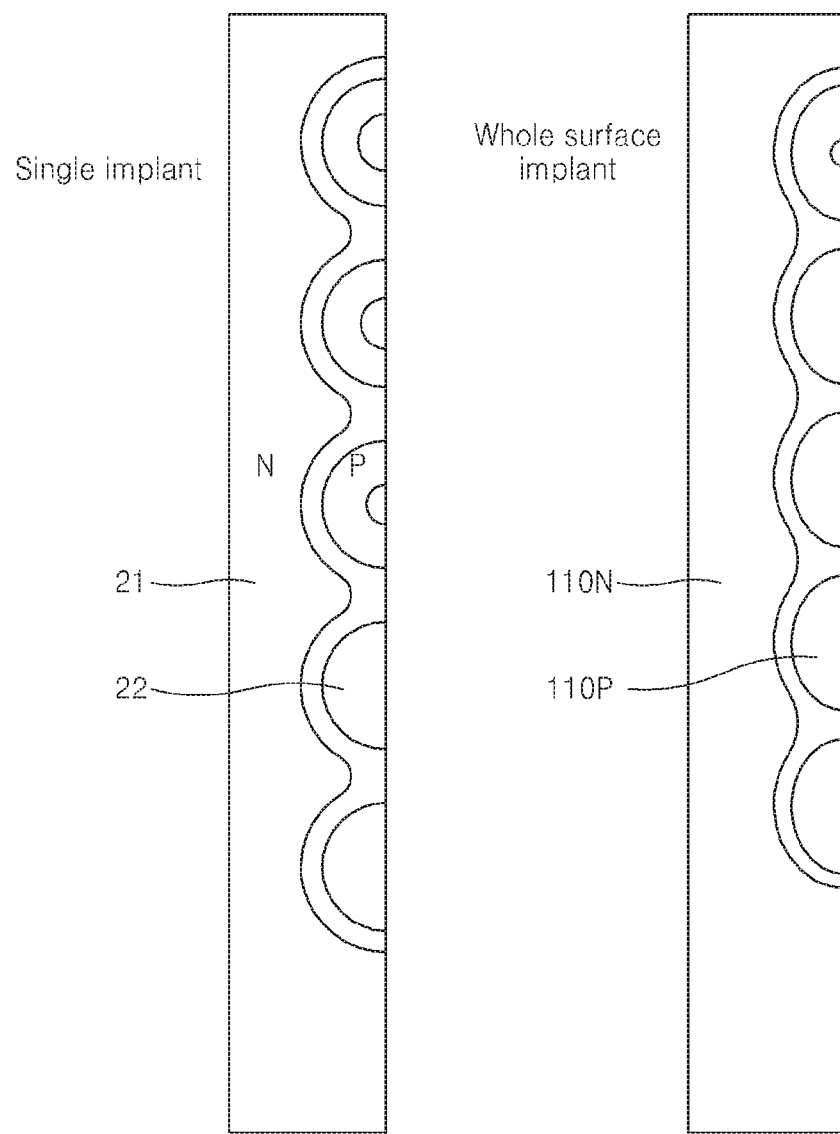
FIG. 18 illustrates cross-sectional views for comparing a pillar formed using a whole surface-implanting method to a pillar formed using a single implant method.

FIG. 18 illustrates cross-sectional views for comparing a pillar formed using the whole surface-implanting method to a pillar formed using the single implant method.

Referring to FIG. 18, a left cross-sectional view illustrates a side profile of a P-type pillar 22 formed using the single implant method, and a right cross-section view illustrates a side profile of the P-type pillar 110P formed using the whole surface-implanting method according to the one or more embodiments. As illustrated in FIG. 18, it is possible to see that the side profile of the P-type pillar 110P formed using the whole surface-implanting method is further smooth, compared to the side profile of the P-type pillar 22 formed using the single implant method. In other words, a side surface curve of the P-type pillar 110P formed using the whole surface-implanting method is smaller, compared to the P-type pillar 22 formed using the single implant method.

In this regard, according to the whole surface-implanting method, both the N-type pillar 110N and the P-type pillar 110P are formed via diffusion, but according to the single implant method, N-type and P-type pillars are formed by only a P-type dopant diffused from a P-type source layer, so that a side surface curve of the P-type pillar 22 formed using the single implant method is large.

Figure 19:
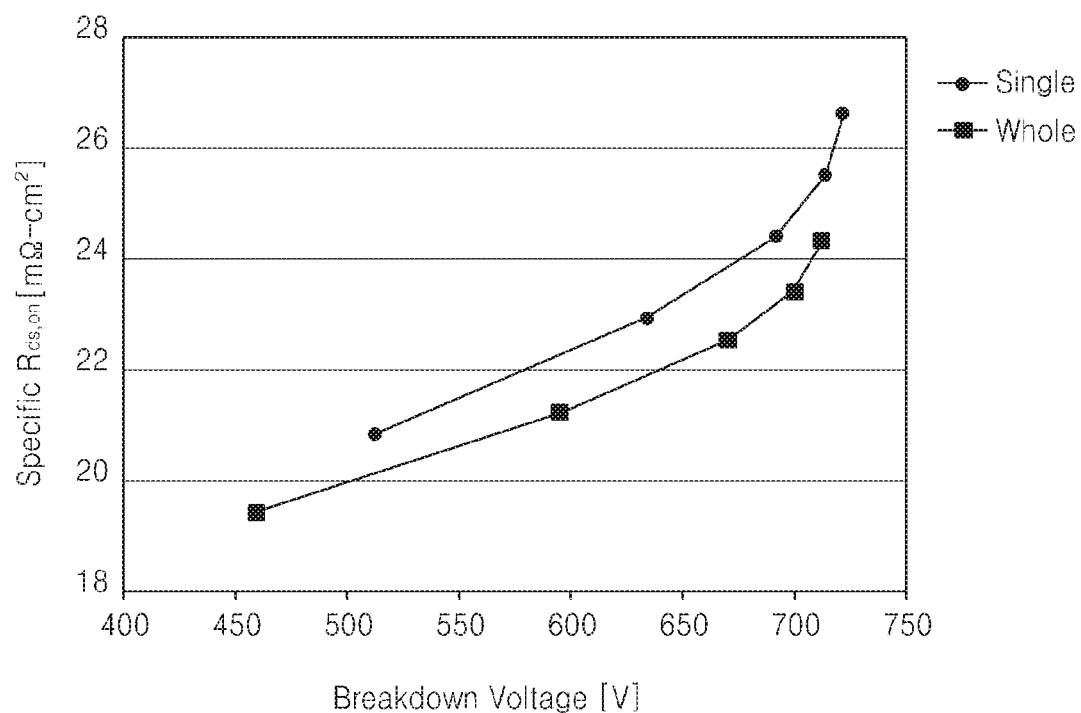
FIG. 19 is a graph for comparing a curve of a breakdown voltage (BV)-Rds characteristic in a semiconductor device manufactured using the whole surface-implanting method to a curve of a BV-Rds characteristic in a semiconductor device manufactured using the single implant method.

FIG. 19 is a graph for comparing a curve of a BV-Rds characteristic in a semiconductor device manufactured using the whole surface-implanting method to a curve of a BV-Rds characteristic in a semiconductor device manufactured using the single implant method. In the graph of FIG. 19, BV indicates a breakdown voltage, and $R_{ds,on}$ indicates a resistance between a drain and a source at an on-status.

Referring to FIG. 19, it is possible to see that the BV-Rds characteristic of the semiconductor device manufactured using the whole surface-implanting method according to the one or more embodiments is excellent, compared to the semiconductor device manufactured using the single implant method. In other words, at the same BV, a value of $R_{ds,on}$ of the semiconductor device manufactured using the whole surface-implanting method is less than the semiconductor device manufactured using the single implant method, by about 1 mΩcm$^{-2}$.

Figure 20:
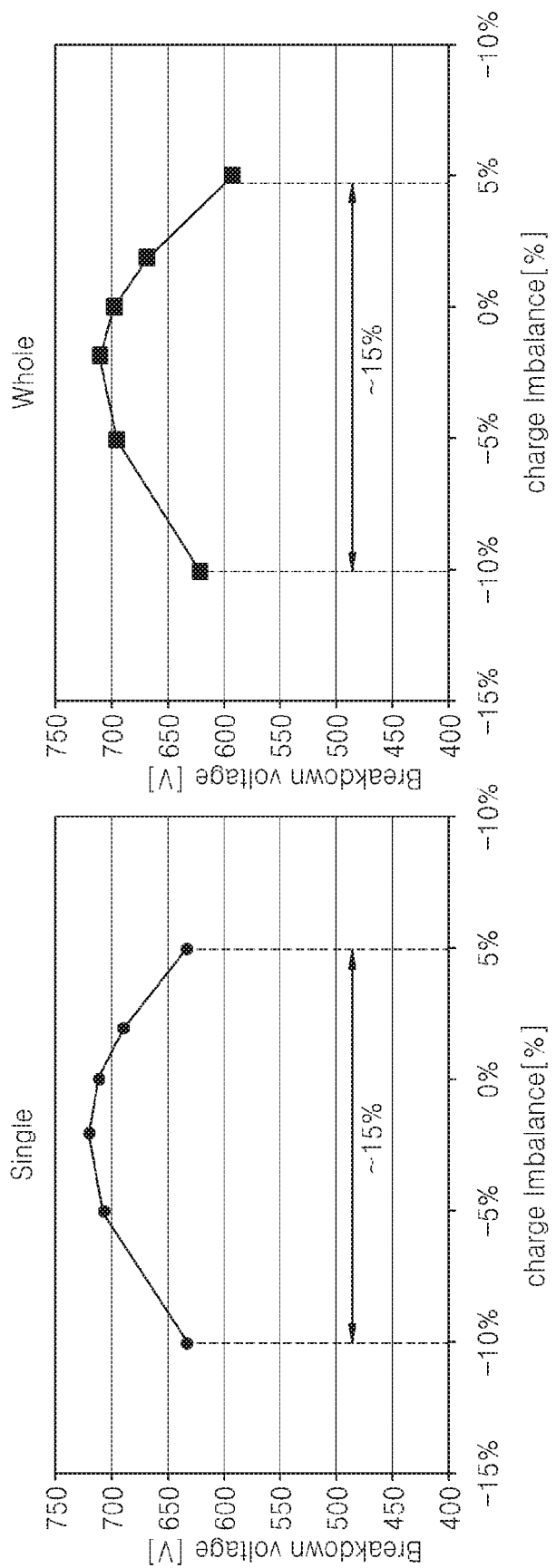
FIG. 20 illustrates graphs for comparing a BV in charge imbalance of a semiconductor device manufactured using the whole surface-implanting method to a BV in charge imbalance of a semiconductor device manufactured using the single implant method.

FIG. 20 illustrates graphs for comparing a BV in charge imbalance of a semiconductor device manufactured using the whole surface-implanting method to a BV in charge imbalance of a semiconductor device manufactured using the single implant method.

Referring to FIG. 20, a left graph illustrates the BV in the charge imbalance of the semiconductor device manufactured using the single implant method, and a right graph illustrates the BV in the charge imbalance of the semiconductor device manufactured using the whole surface-implanting method.

In the graphs, levels of charge balance profiles that are allowed with respect to 600 V are not highly different from each other. For example, the levels are about 15%. However, in consideration of management at the aforementioned 3-sigma level, the whole surface-implanting method according to the one or more embodiments, which has a value of 2%, is further advantageous so as to obtain a stable BV in mass production.

According to a semiconductor device having a super junction and a method of manufacturing the same according to the one or more embodiments, N-type pillars and P-type pillars of the semiconductor device are formed using the undoped epi-layer forming and N-type dopant whole surface-implanting method, so that charge balance of the super junction may be further accurately controlled.

Thus, according to the semiconductor device having the super junction and the method of manufacturing the same according to the one or more embodiments, it is possible to embody a reliable high voltage semiconductor device having a high BV, based on the charge balance that is accurately controlled in the super junction.

While the inventive concept has been particularly shown and described with reference to exemplary embodiments thereof, it will be understood that various changes in form and details may be made therein without departing from the spirit and scope of the following claims.

What is claimed is:

1. A method of manufacturing a semiconductor device having a super junction, the method comprising:
    preparing a semiconductor substrate that includes an active region and a termination region surrounding the active region;
    epitaxially forming a first undoped epitaxial layer over the semiconductor substrate, the first undoped epitaxial layer having a first thickness;
    implanting dopants of a first conductive type in an entire top surface of the first undoped epitaxial layer to form a first doped layer of the first conductive type;
    implanting dopants of a second conductive type in predetermined portions of the first doped layer;
    epitaxially forming a second undoped epitaxial layer over the first doped layer, the second undoped epitaxial layer having a second thickness that is smaller than the first thickness;
    implanting dopants of the first conductive type in an entire top surface of the second undoped epitaxial layer to form a second doped layer of the first conductive type;
    implanting dopants of the second conductive type in predetermined portions of the second doped layer;
    epitaxially forming a third undoped epitaxial layer over the second doped layer, the third undoped epitaxial layer having a third thickness that is smaller than the second thickness;
    implanting dopants of the first conductive type in an entire top surface of the third undoped epitaxial layer to form a third doped layer of the first conductive type;
    implanting dopants of the second conductive type in predetermined portions of the third doped layer; and
    diffusing dopants of at least the first, second, and third doped layers to the first, second, and third undoped epitaxial layers in order to form a blocking layer in the active region and to form a termination pillar in the termination region, the blocking layer comprising a first conductive type pillar and a second conductive type pillar that extend in a vertical direction on the semiconductor substrate and that are alternately arrayed in a horizontal direction.

2. The method of claim 1, wherein the first conductive type is N-type and the second conductive type is P-type.

3. The method of claim 1, wherein a density profile of dopants of the first conductive type is uniform in the horizontal direction in both the first and second conductive type pillars in the blocking layer.

4. The method of claim 1, wherein diffusing dopants from at least the first and second doped layers is by thermal treatment.

5. The method of claim 1, wherein a density profile of dopants of the first conductive type is uniform in the horizontal direction in both the first and second conductive type pillars, and the density profile of dopants of the first conductive type varies in the vertical direction in the blocking layer.

6. The method of claim 1, further comprising forming a first conductive type epi-layer between the first undoped epitaxial layer and the semiconductor substrate.

7. The method of claim 1, wherein the termination pillar comprises a first conductive type termination pillar and a second conductive type termination pillar.

8. The method of claim 1, wherein diffusing dopants of at least the first, second, and third doped layers further comprises:
    diffusing the dopants of the at least the first, second, and third doped layers to form an edge second conductive type pillar that is disposed between the active region and the termination region to surround the active region,
    wherein the edge second conductive type pillar is coupled to a source electrode.

9. The method of claim 1, further comprising:
    forming a gate oxide layer over the first conductive type pillar;
    forming a gate electrode over the gate oxide layer;
    forming a body layer in an upper region of the second conductive type pillar;
    forming at least one source region in the body layer; and
    forming a source electrode electrically connected to the at least one source region.

10. The method of claim 1, further comprising, before the diffusing:
    forming a top undoped epitaxial layer over the third doped layer that is the uppermost layer; and
    implanting dopants of the first conductive type in an upper region of the top undoped epitaxial layer.

* * * * *